US009128391B2

(12) United States Patent
Moriya et al.

(10) Patent No.: US 9,128,391 B2
(45) Date of Patent: Sep. 8, 2015

(54) OPTICAL DEVICE INCLUDING WAVEFRONT CORRECTION PARTS AND BEAM DIRECTION PARTS, LASER APPARATUS INCLUDING THE OPTICAL DEVICE, AND EXTREME ULTRAVIOLET LIGHT GENERATION SYSTEM INCLUDING THE LASER APPARATUS

(75) Inventors: Masato Moriya, Oyama (JP); Osamu Wakabayashi, Hiratsuka (JP)

(73) Assignee: GIGAPHOTON INC., Tochigi (JP)

( * ) Notice: Subject to any disclaimer, the term of this patent is extended or adjusted under 35 U.S.C. 154(b) by 187 days.

(21) Appl. No.: 13/637,942

(22) PCT Filed: Nov. 23, 2011

(86) PCT No.: PCT/IB2011/002795
§ 371 (c)(1),
(2), (4) Date: Sep. 27, 2012

(87) PCT Pub. No.: WO2012/073087
PCT Pub. Date: Jun. 7, 2012

(65) Prior Publication Data
US 2013/0015319 A1    Jan. 17, 2013

(30) Foreign Application Priority Data

Nov. 29, 2010 (JP) .................................. 2010-265787
Aug. 12, 2011 (JP) .................................. 2011-176874

(51) Int. Cl.
*G03F 7/20*     (2006.01)
*H05G 2/00*    (2006.01)
(Continued)

(52) U.S. Cl.
CPC ............ *G03F 7/708* (2013.01); *G03F 7/70008* (2013.01); *G03F 7/7085* (2013.01);
(Continued)

(58) Field of Classification Search
USPC ......... 250/216, 203.1, 208.2, 208.1; 356/349, 356/358, 345, 487, 500, 482, 486, 497
See application file for complete search history.

(56) References Cited

U.S. PATENT DOCUMENTS 5,631,736 A * 5/1997 Thiel et al. .................... 356/486
6,259,712 B1 * 7/2001 DeCain et al. ................. 372/32
(Continued)

FOREIGN PATENT DOCUMENTS

EP      2133658 A1    12/2009

OTHER PUBLICATIONS

International Search Report mailed May 9, 2012 issued in corresponding International Application No. PCT/IB2011/002795.
(Continued)

*Primary Examiner* — Francis M Legasse, Jr.
(74) *Attorney, Agent, or Firm* — McDermott Will & Emery LLP

(57) ABSTRACT

An optical device may include a mirror for respectively reflecting and transmitting parts of a first laser beam as first reflected and first transmitted beams, and for respectively transmitting and reflecting parts of a second laser beam as second transmitted and second reflected beams; an optical system disposed so that the first and second laser beams are such that beam paths of the first transmitted and second reflected beams are parallel or substantially coincide, or such that beam paths of the first reflected and second transmitted beams are parallel or substantially coincide; first and second measuring units configured to respectively measure a beam parameter of the first transmitted or first reflected beams, and of the second reflected or second transmitted beams; and first and second adjusting units configured to adjust the first and second laser beams based on measurement results by the measuring units.

16 Claims, 23 Drawing Sheets

(51) Int. Cl.
  *H01S 3/00* (2006.01)
  *H01S 3/225* (2006.01)
  *H01S 3/23* (2006.01)
(52) U.S. Cl.
  CPC ............ *H05G 2/008* (2013.01); *H01S 3/005* (2013.01); *H01S 3/0071* (2013.01); *H01S 3/2253* (2013.01); *H01S 3/2316* (2013.01)

(56) References Cited

U.S. PATENT DOCUMENTS

| | | |
|---|---|---|
| 2004/0246871 A1 | 12/2004 | Kim et al. |
| 2005/0057756 A1* | 3/2005 | Fang-Yen et al. .............. 356/497 |
| 2008/0149862 A1 | 6/2008 | Hansson et al. |
| 2008/0233719 A1 | 9/2008 | Omata |
| 2009/0310141 A1* | 12/2009 | Miyata ......................... 356/487 |
| 2010/0117009 A1 | 5/2010 | Moriya et al. |
| 2010/0327192 A1 | 12/2010 | Fomenkov et al. |
| 2011/0220816 A1 | 9/2011 | Kakizaki et al. |

OTHER PUBLICATIONS

International Preliminary Report on Patentability issued in International Application No. PCT/IB2011/002795 Jun. 4, 2013.

* cited by examiner

OPTICAL DEVICE INCLUDING WAVEFRONT CORRECTION PARTS AND BEAM DIRECTION PARTS, LASER APPARATUS INCLUDING THE OPTICAL DEVICE, AND EXTREME ULTRAVIOLET LIGHT GENERATION SYSTEM INCLUDING THE LASER APPARATUS

CROSS-REFERENCE TO RELATED APPLICATIONS

The present application claims priority from Japanese Patent Application No. 2010-265787 filed Nov. 29, 2010, and Japanese Patent Application No. 2011-176874 filed Aug. 12, 2011.

BACKGROUND

1. Technical Field

This disclosure relates to an optical device, a laser apparatus including the optical device, and an extreme ultraviolet (EUV) light generation system including the laser apparatus.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication at 32 nm or less, for example, an exposure apparatus is expected to be developed, in which an apparatus for generating extreme ultraviolet (EUV) light, at a wavelength of approximately 13 nm is combined with a reduced projection reflective optical system.

Three kinds of apparatuses for generating EUV light have been known in general, which include an LPP (Laser Produced Plasma) type apparatus in which plasma generated by irradiating a target material with a laser beam is used, a DPP (Discharge Produced Plasma) type apparatus in which plasma generated by electric discharge is used, and an SR (synchrotron radiation) type apparatus in which orbital radiation is used.

SUMMARY

An optical device according to one aspect of this disclosure may include: a mirror configured to reflect part of a first laser beam incident on one principal surface thereof as a first reflected beam and transmit the other part of the first laser beam through the mirror as a first transmitted beam, and to transmit part of a second laser beam incident on the other principal surface thereof through the mirror as a second transmitted beam and reflect the other part of the second laser beam as a second reflected beam; an optical system disposed so that the first and second laser beams are incident on the mirror such that a beam path of the first transmitted beam and a beam path of the second reflected beam are made to be parallel to each other or to substantially coincide with each other, or such that a beam path of the first reflected beam and a beam path of the second transmitted beam are made to be parallel to each other or to substantially coincide with each other; a first measuring unit configured to measure a beam parameter of at least one of the first transmitted beam and the first reflected beam; a second measuring unit configured to measure a beam parameter of at least one of the second reflected beam and the second transmitted beam; a first adjusting unit configured to adjust the first laser beam based on a measurement result by the first measuring unit; and a second adjusting unit configured to adjust the second laser beam based on a measurement result by the second measuring unit.

An optical device according to another aspect of this disclosure may include: a mirror configured to reflect part of a first laser beam and part of a second laser beam incident on one principal surface thereof as a first reflected beam and a second reflected beam, respectively, and to transmit the other parts of the respective laser beams through the mirror as a first transmitted beam and a second transmitted beam, respectively; an optical system disposed so that the first and second laser beams are incident on the mirror such that a beam path of the first transmitted beam and a beam path of the second transmitted beam are made to substantially coincide with each other, or such that a beam path of the first reflected beam and a beam path of the second reflected beam are made to substantially coincide with each other; a beam parameter measuring system including a first measuring unit for measuring a beam parameter of the first transmitted beam, and a second measuring unit for measuring a beam parameter of the second transmitted beam; a first adjusting unit configured to adjust the first laser beam based on a measurement result by the first measuring unit; and a second adjusting unit configured to adjust the second laser beam based on a measurement result by the second measuring unit.

A laser apparatus according to yet another aspect of this disclosure may include one of the above optical devices.

An extreme ultraviolet light generation system according to still another aspect of this disclosure may include: one of the above optical devices; a laser apparatus; a chamber; a droplet generator provided in the chamber, for supplying a target material into a predetermined region inside the chamber; and a focusing optical system for focusing the first reflected beam and the second transmitted beam, respectively, in the predetermined region inside the chamber, or for focusing the first transmitted beam and the second reflected beam, respectively, in the predetermined region inside the chamber.

An extreme ultraviolet light generation system according to still another aspect of this disclosure may include: one of the above optical devices; a laser apparatus; a chamber; a droplet generator provided in the chamber, for supplying a target material into a predetermined region inside the chamber; and a focusing optical system for focusing the first reflected beam and the second reflected beam, respectively, in the predetermined region inside the chamber.

DESCRIPTION OF PREFERRED EMBODIMENTS

Figure 1:
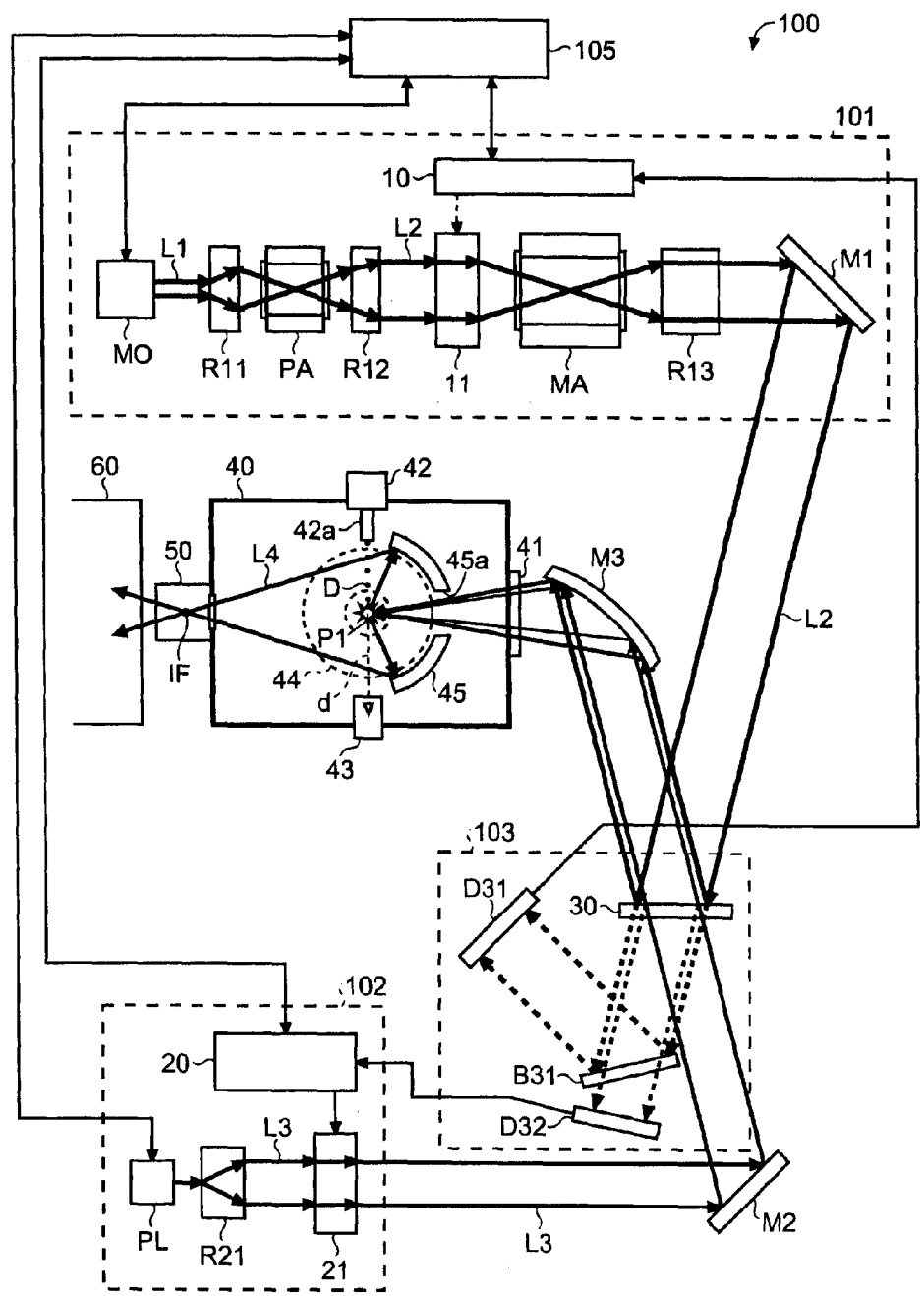
FIG. 1 schematically illustrates the configuration of an EUV light generation system according to a first embodiment of this disclosure.

Hereinafter, selected embodiments of this disclosure will be described in detail with reference to the accompanying drawings. The embodiments to be described below are merely illustrative in nature and do not limit the scope of this disclosure. Further, configurations and operations described in each embodiment are not all essential in implementing this disclosure. It should be noted that like elements are referenced by like reference numerals or symbols and duplicate descriptions thereof will be omitted herein.

The embodiments of this disclosure will be illustrated following the table of contents below.
1. First Embodiment
  1.1 Beam Parameter Measuring Unit
    1.1.1 Beam Path Adjusting Part
    1.1.2 Modification of Beam Path Adjusting Part
    1.1.3 Beam Parameter Measuring Part
    1.1.4 First Modification of Beam Parameter Measuring Part
    1.1.5 Second Modification of Beam Parameter Measuring Part
  1.2 Beam Correction Unit
    1.2.1 Wavefront Correction Part
    1.2.2 Modification of Wavefront Correction Part
    1.2.3 Beam Direction Correction Part
  1.3 First Modification of Beam Correction Unit
  1.4 Second Modification of Beam Correction Unit
  1.5 Third Modification of Beam Correction Unit
  1.6 Fourth Modification of Beam Correction Unit
  1.7 Beam Parameter Control
    1.7.1 Beam Parameter Quantification Processing of Pre-pulse Laser Beam
    1.7.2 Beam Parameter Quantification Processing of Main Pulse Laser Beam
    1.7.3 Beam Parameter Control Processing of Pre-pulse Laser Beam
    1.7.2 Beam Parameter Control Processing of Main Pulse Laser Beam
2. Second Embodiment
  2.1 Modification of Beam Path Adjusting Part
3. Third Embodiment
  3.1 First Modification of Third Embodiment
  3.2 Second Modification of Third Embodiment
4. Fourth Embodiment
5. Fifth Embodiment
  5.1 Modification of Beam Path Adjusting Part of Fifth Embodiment
  5.2 EUV Light Generation System
6. Sixth Embodiment
  6.1 Modification of Sixth Embodiment

1. First Embodiment

Hereinafter, a first embodiment of this disclosure will be described in detail with reference to the accompanying drawings. FIG. 1 schematically illustrates an extreme ultraviolet (EUV) light generation system according to the first embodiment. An EUV light generation system 100 may include a driver laser 101, a pre-pulse laser 102, a beam parameter measuring unit 103, and a chamber 40.

The driver laser 101 may include a master oscillator MO, a preamplifier PA, a main amplifier MA, relay optical systems R11 through R13, a beam correction unit 11, a beam controller 10, and a high-reflection mirror M1.

The master oscillator MO may be configured to output a pulsed laser beam as a seed beam L1. The master oscillator MO may include, for example, a semiconductor laser, such as a quantum cascade laser and/or a distributed-feedback semiconductor laser. However, various other types of lasers, such as a solid-state laser, may be used as well.

The seed beam L1 outputted from the master oscillator MO may have the beam diameter thereof expanded by the relay optical system R11. The seed beam L1, which has a beam diameter that has been expanded, may enter the preamplifier PA. The preamplifier PA may include $CO_2$ gas as a gain medium, for example. The relay optical system R11 may be configured to expand the diameter of the seed beam L1 such that the seed beam L1 passes through the amplification region inside the preamplifier PA efficiently. The preamplifier PA may be configured to amplify, of the seed beam L1 having entered thereinto, a laser beam at a wavelength contained in at least one gain bandwidth of the gain medium. The amplified seed beam L1 may be outputted, as a main pulse laser beam L2, from the preamplifier PA.

The laser beam L2 outputted from the preamplifier PA may be incident on the relay optical system R12. The relay optical system R12 may be configured to expand the beam diameter of the laser beam L2 such that the laser beam L2 passes through the amplification region inside the main amplifier MA efficiently. Further, the relay optical system R12 may be configured to collimate the laser beam L2. The laser beam L2 may then enter the main amplifier MA via the beam correction unit 11. The beam correction unit 11 and the beam controller 10 will be described later. The main amplifier MA, as in the preamplifier PA, may include $CO_2$ gas as a gain medium. The main amplifier MA, as in the preamplifier PA, may be configured to amplify, of the laser beam L2 entering thereinto, a laser beam at a wavelength contained in at least one gain bandwidth of the gain medium. Here, the laser beam L2 may be amplified efficiently when the gain bandwidths of the preamplifier PA and of the main amplifier MA are matched with each other. That is, the laser beam L2 may be amplified efficiently when the same gain medium ($CO_2$ gas, for example) is used as the gain medium for both the preamplifier PA and the main amplifier MA.

The laser beam L2 outputted from the main amplifier MA may be collimated by the relay optical system R13. The collimated laser beam L2 may be reflected by the high-reflection mirror M1, to thereby be outputted from the driver laser 101 and inputted to the beam parameter measuring unit 103. It should be noted that the relay optical system R13 and the high-reflection mirror M1 may not be included in the driver laser 101.

The pre-pulse laser 102 may include a pre-pulse laser source PL, a relay optical system R21, a beam correction unit 21, and a beam controller 20.

The pre-pulse laser source PL may be configured to output a pulsed laser beam as a pre-pulse laser beam L3. The pre-pulse laser beam L3 may strike a target material (droplet D) supplied into the chamber 40. The pre-pulse laser source PL may include, for example, a semiconductor laser, such as a quantum cascade laser and/or a distributed-feedback semiconductor laser. However, various other types of lasers, such as a solid-state laser, may be used as well.

The pre-pulse laser beam L3 outputted from the pre-pulse laser source PL may have the beam diameter thereof expanded by the relay optical system R21. The pre-pulse laser beam L3, which has a beam diameter that has been expanded, may be outputted from the pre-pulse laser 102 via the beam correction unit 21 and inputted to the beam parameter measuring unit 103.

The beam parameter measuring unit 103 may include a beam path adjusting part and a beam parameter measuring part. The beam path adjusting part may be configured to adjust beam paths of the main pulse laser beam L2 and of the pre-pulse laser beam L3 such that the beam paths are parallel to each other and at least parts of the respective beam paths overlap spatially with each other. The beam parameter measuring part may be configured to measure beam parameters of the main pulse laser beam L2 and of the pre-pulse laser beam L3, respectively. Detailed description of the beam path adjusting part and the beam parameter measuring part will be given later.

The pre-pulse laser beam L3 and the main pulse laser beam L2, which have respective beam paths that are adjusted by the beam path adjusting part, may be incident on an off-axis paraboloidal mirror M3. The off-axis paraboloidal mirror M3 may reflect the pre-pulse laser beam L3 and the main pulse laser beam L2 incident thereon such that the respective laser beams are focused in a plasma generation region P1 defined inside the chamber 40. The pre-pulse laser beam L3 and the main pulse laser beam L2 reflected by the off-axis paraboloidal mirror M3 may enter the chamber 40 via a window 41. The window 41 may preferably be disposed so as to be inclined at 3 to 5 degrees with respect to the direction in which the laser beam incident thereon travels, so that the laser beam reflected at a surface of the window 41 does not form a hot spot on a surface of an optical element in an optical system, such as the relay optical system R13, disposed upstream therefrom. The pre-pulse laser beam L3 and the main pulse laser beam L2 having entered the chamber 40 via the window 41 may each travel through a through-hole 45a formed in an EUV collector mirror 45 disposed inside the chamber 40 and be focused in the plasma generation region P1.

A target material (Sn, for example) outputted, in the form of droplets D, from a droplet generator 42 through a nozzle 42a may be supplied to the plasma generation region P1. The droplet D may be irradiated by the pre-pulse laser beam L3 in the plasma generation region P1. With this, the droplet D, in part or in its entirety, may be turned into pre-plasma. The pre-plasma may then be irradiated by the main pulse laser beam L2. With this, the pre-plasma may be turned into plasma, whereby EUV light L4 may be emitted from the plasma. A beam dump (not shown) may be disposed on an extension of an irradiation axis of the pre-pulse laser beam L3, for absorbing the pre-pulse laser beam L3. Further, a target collection unit 43 may be disposed on an extension of a trajectory of the droplet D, for collecting the target material that has not been turned into plasma.

Here, the pre-plasma may be plasma, such as plasma having an electron temperature and/or an electron density that are/is relatively low, generated at a surface of a lump of the target material, such as the droplet D, or may be a cloud-like collection of neutral particles. Alternatively, the pre-plasma may be a mixture of plasma, such as plasma having an electron temperature and/or an electron density that are/is relatively low, and neutral particles. When the target material in a pre-plasma state is irradiated by the main pulse laser beam L2, plasma, such as plasma having an electron temperature and/or an electron density that are/is relatively high, may be generated. It is known that a relatively large amount of EUV light may be emitted from the plasma, such as plasma having an electron temperature and/or an electron density that are/is relatively high.

The EUV light L4 emitted from the plasma may be reflected by the EUV collector mirror 45 so as to be focused towards an intermediate focus IF defined outside the chamber 40. The intermediate focus IF may be defined in an exposure apparatus connection 50 serving to connect the chamber 40 to an exposure apparatus 60. The EUV light L4, after being focused towards the intermediate focus IF, may be introduced into the exposure apparatus 60. The EUV light L4 introduced into the exposure apparatus 60 may be used for lithography or the like in a semiconductor process, for example.

1.1 Beam Parameter Measuring Unit

The beam parameter measuring unit 103 will be described next. The beam path adjusting part of the beam parameter measuring unit 103 may include a dichroic mirror 30, for example. The beam parameter measuring part of the beam parameter measuring unit 103 may include, for example, a beam splitter B31 and beam parameter sensors D31 and D32.

1.1.1 Beam Path Adjusting Part

Figure 2:
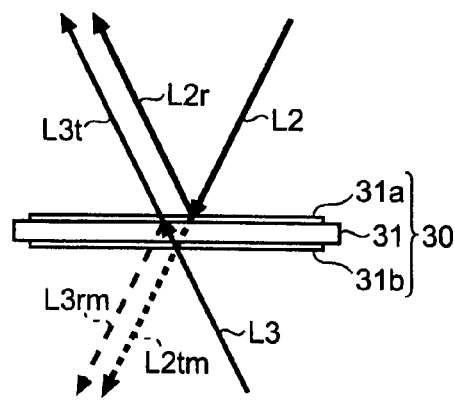
FIG. 2 illustrates an example of a beam path adjusting part according to the first embodiment.

FIG. 2 illustrates an example of a dichroic mirror functioning as the beam path adjusting part. The dichroic mirror 30 may include a planar diamond substrate 31, for example. The diamond substrate 31 may have, on one principal surface thereof, a thin-film coating 31a formed thereon, the thin-film coating 31a having high reflectivity for the main pulse laser beam L2 and high transmissivity for the pre-pulse laser beam L3. In some examples, the thin-film coating 31a may suppress reflection of the pre-pulse laser beam L3 with high efficiency. The diamond substrate 31 may have, on the other principal surface thereof, a thin-film coating 31b formed thereon, the thin-film coating 31b having high transmissivity for both the pre-pulse laser beam L3 and the main pulse laser beam L2. Such configuration may allow the dichroic mirror 30 to reflect a large part of the main pulse laser beam L2 and to transmit the rest thereof as a transmitted beam L2tm, for example. Further, this configuration may allow the dichroic mirror 30 to transmit a large part of the pre-pulse laser beam 13 and reflect the rest thereof as a reflected beam L3rm. Here, the term "the rest" may exclude part of the laser beam which is absorbed when being transmitted through the dichroic mirror 30.

The main pulse laser beam L2 may be incident on the one principal surface of the dichroic mirror 30. The pre-pulse laser beam L3 may be incident on the other principal surface of the dichroic mirror 30. Angles at which the main pulse laser beam L2 and the pre-pulse laser beam L3 are incident on the dichroic mirror 30, respectively, may be adjusted so as to satisfy the following conditions (a) and (b).

(a) The direction in which a reflected beam L2r of the main pulse laser beam L2 travels and the direction in which a transmitted beam L3t of the pre-pulse laser beam L3 travels substantially coincide with each other, and at least part of the beam path of the reflected beam L2r and at least part of the beam path of the transmitted beam L3t overlap spatially with each other.

(b) The direction in which the transmitted beam L2tm of the main pulse laser beam L2 travels and the direction in which the reflected beam L3rm of the pre-pulse laser beam L3 travels substantially coincide with each other, and at least part of the beam path of the transmitted beam L2tm and at least part of the beam path of the reflected beam L3rm overlap spatially with each other.

The reflected beam L2r of the main pulse laser beam L2 and the transmitted beam L3t of the pre-pulse laser beam L3 may be reflected by the off-axis paraboloidal mirror M3, to thereby be introduced into the chamber 40. Meanwhile, the transmitted beam L2tm of the main pulse laser beam L2 and the reflected beam L3rm of the pre-pulse laser beam L3 may be incident on the beam parameter measuring part of the beam parameter measuring unit 103.

1.1.2 Modification of Beam Path Adjusting Part

Figure 3:
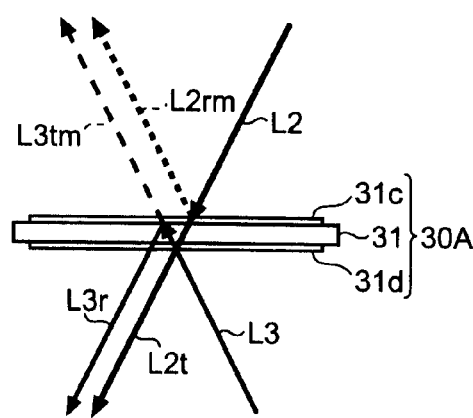
FIG. 3 illustrates a modification of the beam path adjusting part according to the first embodiment.

A dichroic mirror 30A as shown in FIG. 3 may be used to constitute the beam path adjusting part. The diamond substrate 31 of the dichroic mirror 30A may have, on one principal surface thereof, a thin-film coating 31c formed thereon, the thin-film coating 31c having high transmissivity for the main pulse laser beam L2 and high reflectivity for the pre-pulse laser beam L3. In some examples, the thin-film coating 31c may suppress reflection of the main pulse laser beam L2 with high efficiency. The diamond substrate 31 may have, on the other principal surface thereof, a thin-film coating 31d formed thereon, the thin-film coating 31d having high transmissivity for both the pre-pulse laser beam L3 and the main pulse laser beam L2. Such configuration may allow the dichroic mirror 30A to transmit a large part of the main pulse laser beam L2 and reflect the rest thereof as the reflected beam L2rm, for example. Further, this configuration may allow the dichroic mirror 30A to reflect a large part of the pre-pulse laser beam L3 and to transmit the rest thereof as the transmitted beam L3tm. Angles at which the main pulse laser beam L2 and the pre-pulse laser beam L3 are incident on the dichroic mirror 30A, respectively, may be adjusted so as to satisfy the following conditions (c) and (d).

(c) The direction in which the transmitted beam L2t of the main pulse laser beam L2 travels and the direction in which the reflected beam L3r of the pre-pulse laser beam L3 travels substantially coincide with each other, and at least part of the beam path of the transmitted beam L2t and at least part of the beam path of the reflected beam L3r overlap spatially with each other.

(d) The direction in which the reflected beam L2rm of the main pulse laser beam L2 travels and the direction in which the transmitted beam L3tm of the pre-pulse laser beam L3 travels substantially coincide with each other, and at least part of the beam path of the reflected beam L2rm and at least part of the beam path of the transmitted beam L3tm overlap spatially with each other.

The transmitted beam L2t and the reflected beam L3r may be reflected by the off-axis paraboloidal mirror M3, to thereby be introduced into the chamber 40. Meanwhile, the reflected beam L2rm and the transmitted beam L3tm may be incident on the beam parameter measuring part of the beam parameter measuring unit 103.

Here in a case where the wavelength of the main pulse laser beam L2 is approximately 10.6 μm and the wavelength of the pre-pulse laser beam L3 is approximately 1.03 μm, the diamond substrate 31 may suitably be used for the dichroic mirror 30 and for the dichroic mirror 30A.

1.1.3 Beam Parameter Measuring Part

Figure 4:
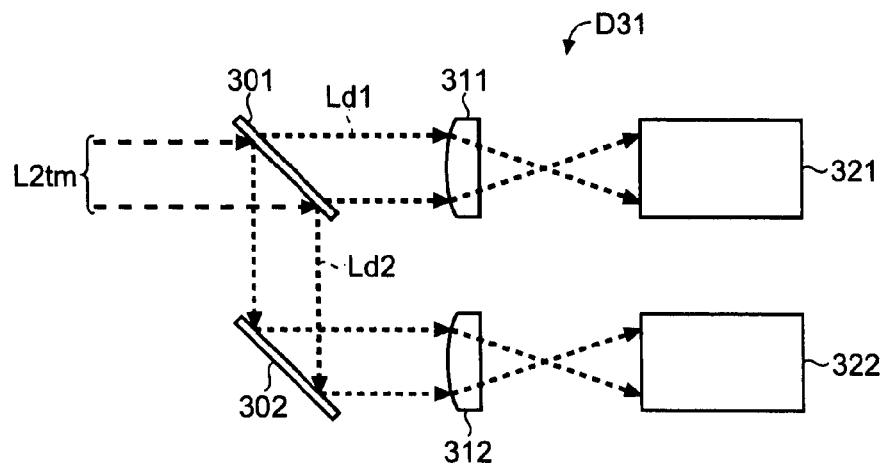
FIG. 4 illustrates an example of a beam parameter sensor according to the first embodiment.

The beam parameter measuring part of the beam parameter measuring unit 103 shown in FIG. 1 will be described. The beam parameter measuring part may include, for example, the beam splitter B31 and the beam parameter sensors D31 and D32. Either one of the transmitted beam L2tm and the reflected beam L3rm (transmitted beam L2tm in this example) incident on the beam parameter measuring part may be reflected by the beam splitter B31, to thereby have the traveling direction thereof be changed. The transmitted beam L2tm, which has a traveling direction that has been changed, may be incident on the beam parameter sensor D31. Meanwhile, the reflected beam L3rm incident on the beam parameter measuring part may be transmitted through the beam splitter B31 and be incident on the beam parameter sensor D32. FIG. 4 illustrates an example of the beam parameter sensor D31. The beam parameter sensor D32 may be configured similarly to the beam parameter sensor D31; thus, only the beam parameter sensor D31 will be described below, for the sake of simplifying the description. Further, as for the laser beam incident on the beam parameter measuring part, only the measuring of beam parameters of the transmitted beam L2tm will be described, for the sake of simplifying the description. Beam parameter of the reflected beam L3rm may be measured with a similar mechanism to that used and described in relation to the transmitted beam L2tm.

As illustrated in FIG. 4, the beam parameter sensor D31 may include a beam splitter 301, a high-reflection mirror 302, convex lenses 311 and 312, and beam profilers 321 and 322. The transmitted beam L2tm may first be incident on the beam splitter 301. A laser beam Ld1 transmitted through the beam splitter 301 may be projected onto a photosensitive surface of the beam profiler 321 by the convex lens 311. Meanwhile, a laser beam Ld2 reflected by the beam splitter 301 may be reflected by the high-reflection mirror 302 and projected onto a photosensitive surface of the beam profiler 322 by the convex lens 312. With this, the beam profiles (intensity profile along a cross-section of the laser beam and the position thereof) of the transmitted beam L2tm at two positions distanced from each other (e.g., two positions separated from each other by a distance) along the beam path of the transmitted beam L2tm may be measured by the beam profilers 321 and 322. Using the beam profiles measured at two positions distanced from each other, the size and the center of the laser beam may be calculated, and further the traveling direction and the curvature of the wavefront of the transmitted beam L2tm may be calculated. The measured parameters of the transmitted beam L2tm may be indicative of the beam parameters of the main pulse laser beam L2.

1.1.4 First Modification of Beam Parameter Measuring Part

Figure 5:
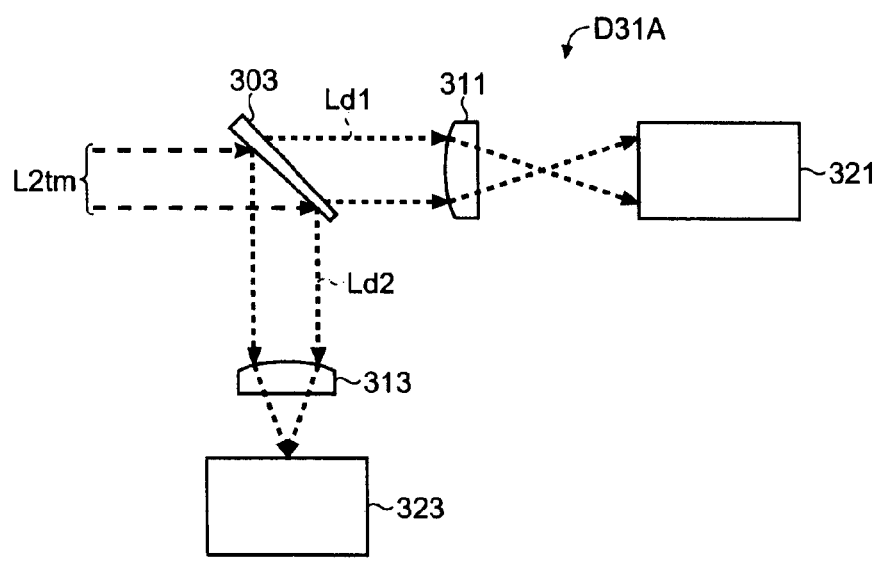
FIG. 5 illustrates a first modification of the beam parameter sensor according to the first embodiment.

The beam parameter sensor D31 may be modified as shown in FIG. 5, as well. As illustrated in FIG. 5, a beam parameter sensor D31A may include a wedge-shaped beam splitter 303, convex lenses 311 and 313, and beam profilers 321 and 323. The convex lens 311 and the beam profiler 321, as in the beam parameter sensor D31, may be configured to measure the beam profile (intensity profile along a cross-section of the laser beam and the position thereof) of the laser beam Ld1 transmitted through the wedge-shaped beam splitter 303. Meanwhile, the beam profiler 323 may be disposed such that the focus of the convex lens 313 lies on the photosensitive surface of the beam profiler 323. With this, the beam profiler 323 may measure the beam profile of the laser beam Ld2, at the beam waist thereof, reflected by the wedge-shaped beam splitter 303. Accordingly, the divergence, the traveling direction, the intensity profile, and so forth, of the transmitted beam L2tm (that is, the main pulse laser beam L2) may be calculated from the divergence and the traveling direction calculated from the measured data.

1.1.5 Second Modification of Beam Parameter Measuring Part

Figure 6:
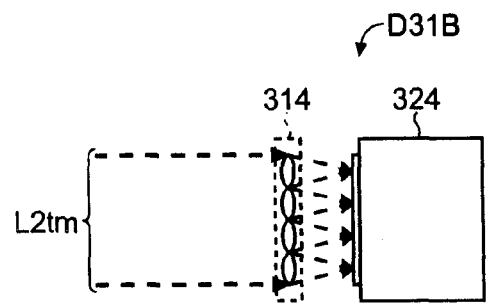
FIG. 6 illustrates a second modification of the beam parameter sensor according to the first embodiment.

A Shack-Hartmann type beam parameter sensor D31B as shown in FIG. 6 may be used as the beam parameter sensor D31, as well. The beam parameter sensor D31B may include a CCD camera 324 and a microlens array 314 disposed so as to face the photosensitive surface of the CCD camera 324. With the Shack-Hartmann type beam parameter sensor D31B, the divergence and the traveling direction of the laser beam may be measured with a single sensor.

1.2 Beam Correction Unit

Figure 7:
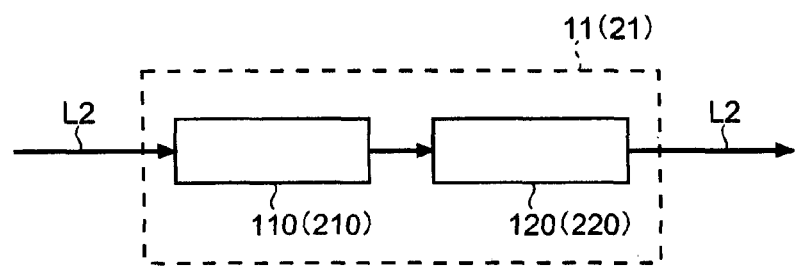
FIG. 7 illustrates an example of a beam correction unit according to the first embodiment.

The beam correction units 11 and 21 shown in FIG. 1 will be described. The beam correction unit 21 may be configured similarly to the beam correction unit 11; thus, only the beam correction unit 11 will be described below. FIG. 7 illustrates an example of the beam correction unit. As illustrated in FIG. 7, the beam correction unit 11 may include a wavefront correction part 110 and a beam direction correction part 120.

1.2.1 Wavefront Correction Part

Figure 8:
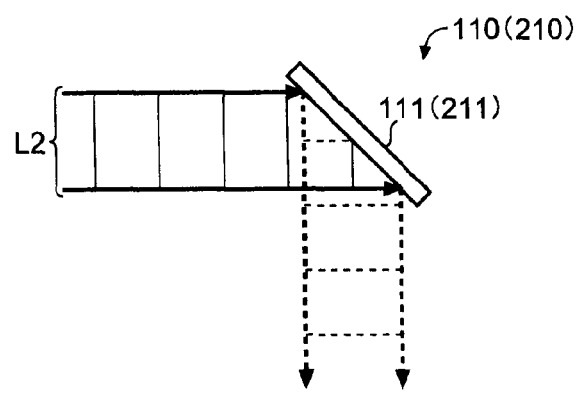
FIG. 8 illustrates an example of a wavefront correction part according to the first embodiment (plane wave).
Figure 9:
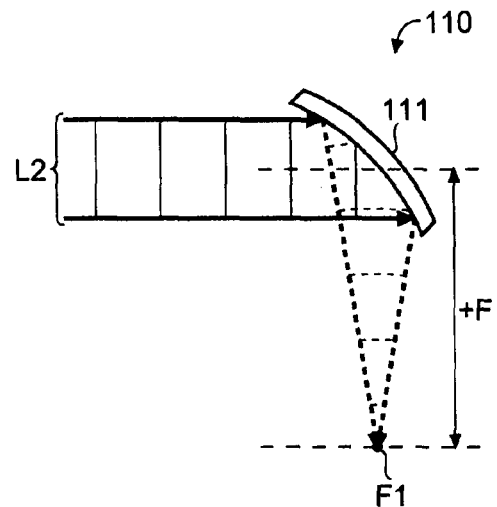
FIG. 9 illustrates an example of the wavefront correction part according to the first embodiment (concave wave).
Figure 10:
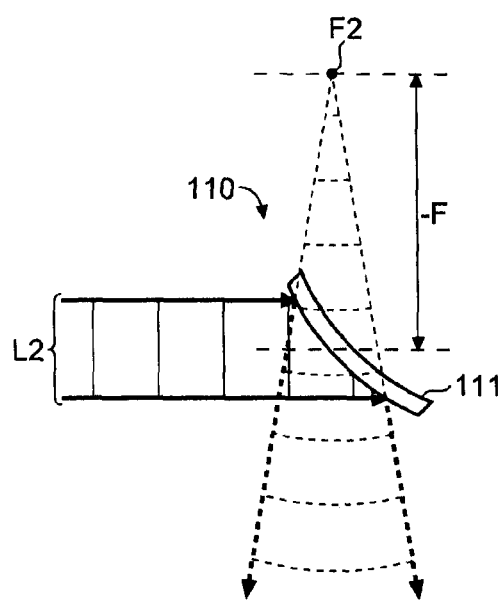
FIG. 10 illustrates an example of the wavefront correction part according to the first embodiment (convex wave).

FIGS. 8 through 10 illustrate an example of the wavefront correction part. The wavefront correction part 110 may include a deformable mirror, which has a reflective surface with a curvature that can be modified, for example. The deformable mirror 111, when the reflective surface thereof is planar, may reflect the collimated main pulse laser beam L2 such that the laser beam L2 remains collimated, as illustrated in FIG. 8. The deformable mirror 111, when the curvature of the reflective surface thereof is adjusted to be concave, may reflect the collimated main pulse laser beam L2 such that the laser beam L2 is focused at a predetermined focus F1 distanced therefrom by a focal distance +F, as illustrated in FIG. 9. Alternatively, the deformable mirror 111, when the curvature of the reflective surface thereof is adjusted to be convex, may reflect the collimated main pulse laser beam L2 as a convex beam such that the laser beam L2 may be focused at a virtual focus F2 distanced therefrom by a focal distance −F, as illustrated in FIG. 10. In this way, the wavefront correction part 110 may include the deformable mirror 111, which has a reflective surface having a curvature that can be modified, such that the wavefront of the reflected laser beam may be adjusted to a predetermined wavefront in accordance with the wavefront of the incident laser beam.

1.2.2 Modification of Wavefront Correction Part

Figure 11:
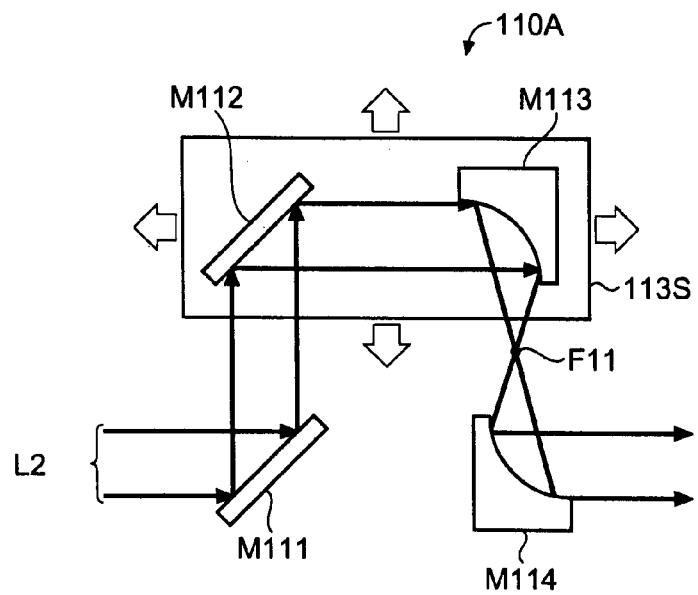
FIG. 11 illustrates a modification of the wavefront correction part according to the first embodiment (without wavefront correction).
Figure 12:
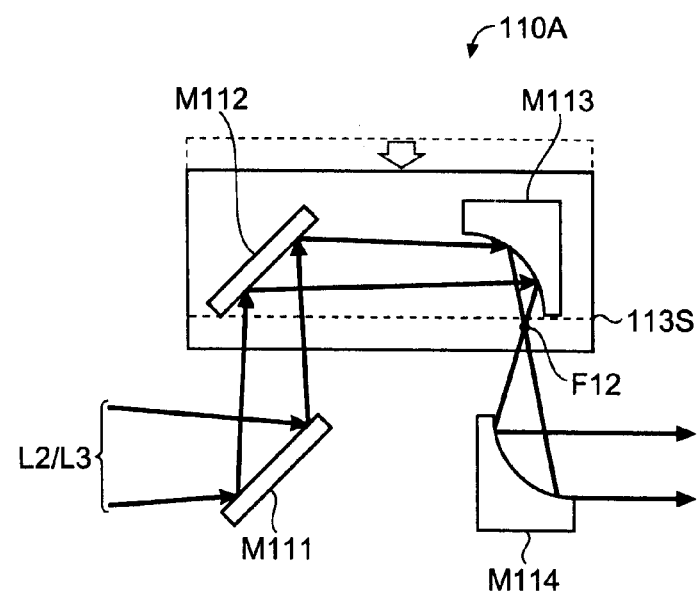
FIG. 12 illustrates the modification of the wavefront correction part according to the first embodiment (with wavefront correction).

FIGS. 11 and 12 illustrate a modification of the wavefront correction part. A wavefront correction part 110A according to the modification may include high-reflection flat mirrors M111 and M112, and off-axis paraboloidal concave mirrors M113 and M114. The high-reflection flat mirror M112 and the off-axis paraboloidal concave mirror M113 may be anchored to a stage 113S capable of being moved with respect to the high-reflection flat mirror M111 and the off-axis paraboloidal concave mirror M114, for example. Adjusting the distance between the off-axis paraboloidal concave mirrors M113 and M114 by moving the stage 113S may allow the wavefront of the main pulse laser beam L2 incident thereon to be adjusted to a predetermined wavefront.

1.2.3 Beam Direction Correction Part

Figure 13:
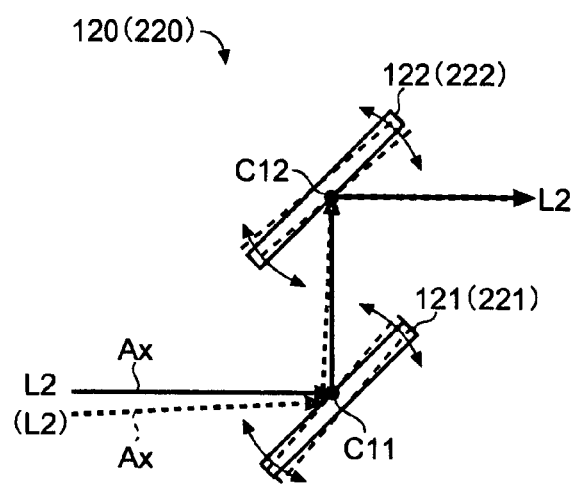
FIG. 13 illustrates an example of a beam direction correction part according to the first embodiment.

The beam direction correction part will be described. FIG. 13 illustrates an example of the beam direction correction part. A beam direction correction part 120 may include at least two high-reflection mirrors 121 and 122. The high-reflection mirrors 121 and 122 may be swingable (or rotatable) about two axes orthogonal to a traveling direction AX of the main pulse laser beam L2, for example. The high-reflection mirror 121 may be swingable in two axial directions about the center C11 in the reflective surface thereof. The high-reflection mirror 122 may be swingable in two axial directions about the center C12 in the reflective surface thereof. Accordingly, the traveling direction of the main pulse laser beam L2 to be outputted from the beam direction correction part 120 may be adjusted to a predetermined direction using the at least two high-reflection mirrors 121 and 122.

1.3 First Modification of Beam Correction Unit

Figure 14:
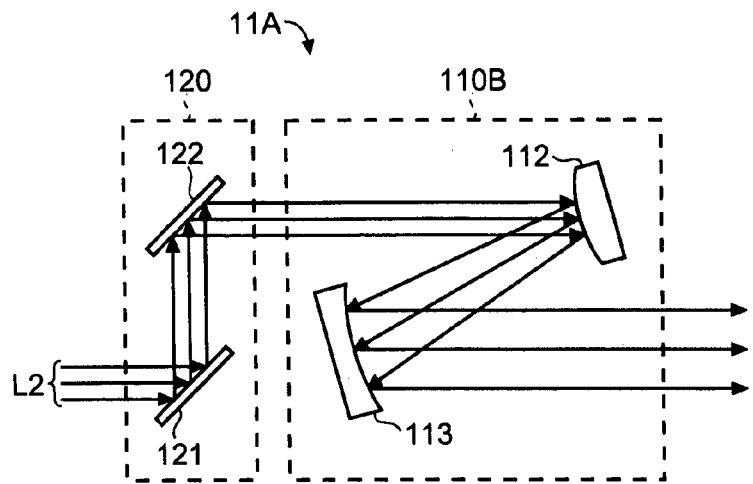
FIG. 14 illustrates a first modification of the beam correction unit according to the first embodiment (without wavefront correction).
Figure 15:
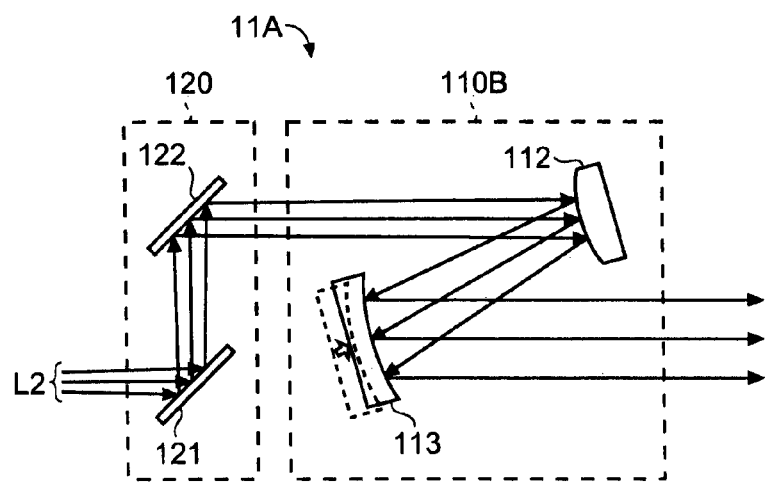
FIG. 15 illustrates the first modification of the beam correction unit according to the first embodiment (with wavefront correction).

The beam correction unit 11 may be modified as shown in FIGS. 14 and 15. A beam correction unit 11A illustrated in FIG. 14 may include the beam direction correction part 120 shown in FIG. 13 and a wavefront correction part 110B, for example. The wavefront correction part 110B may include a convex mirror 112 and a concave mirror 113, for example. In the wavefront correction part 110З, as illustrated in FIG. 15, moving the concave mirror 113 with respect to the convex mirror 112 may allow the wavefront of the main pulse laser beam L2 to be adjusted to a predetermined wavefront.

1.4 Second Modification of Beam Correction Unit

Figure 16:
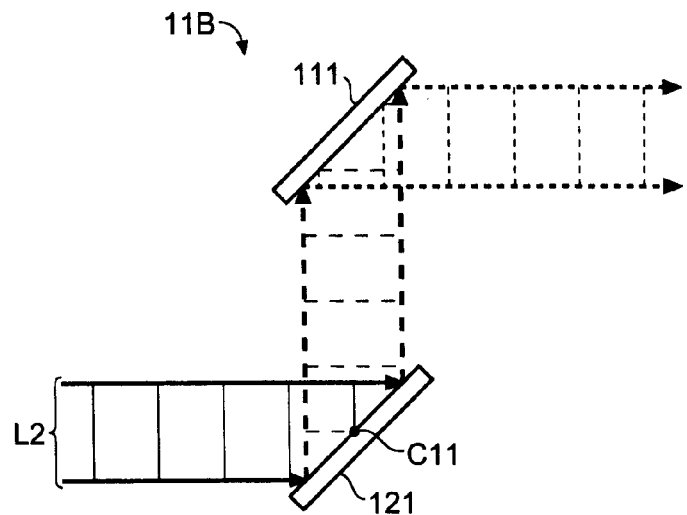
FIG. 16 illustrates a second modification of the beam correction unit according to the first embodiment (without wavefront correction).
Figure 17:
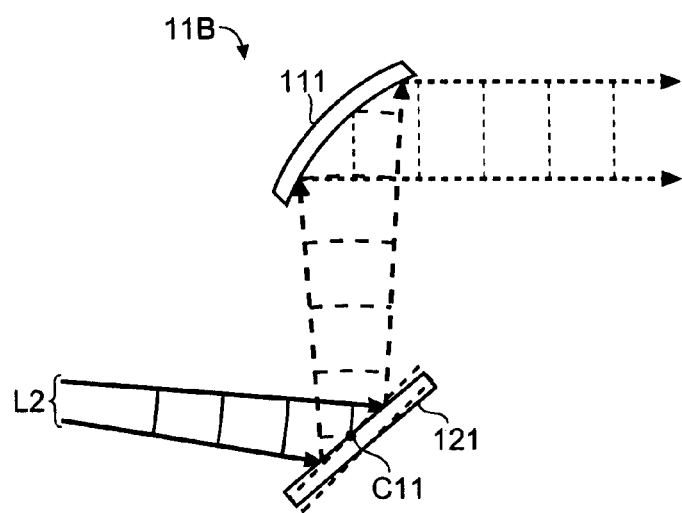
FIG. 17 illustrates the second modification of the beam correction unit according to the first embodiment (with wavefront correction).

The beam correction unit 11 may be modified as shown in FIGS. 16 and 17. A beam correction unit 11B illustrated in FIG. 16 may include the high-reflection mirror 121 and the deformable mirror 111. The beam correction unit 11B may achieve functions of both a wavefront correction part and a beam direction correction part. That is, the high-reflection mirror 121 may adjust the traveling direction of the main pulse laser beam L2 such that the main pulse laser beam L2 is incident on the deformable mirror 111 in a predetermined region of the reflective surface thereof. As illustrated in FIG. 17, the deformable mirror 111 may correct the wavefront of the main pulse laser beam L2 incident thereon and also adjust the direction into which the main pulse laser beam L2 is reflected. With this, the wavefront and the traveling direction of the main pulse laser beam L2 to be outputted from the beam correction unit 11B may be adjusted. Here, the high-reflection mirror 121 may be similar to the high-reflection mirror 121 shown in FIG. 13, and the deformable mirror 111 may be similar to the deformable mirror 111 shown in FIGS. 8 through 11.

1.5 Third Modification of Beam Correction Unit

Figure 18:
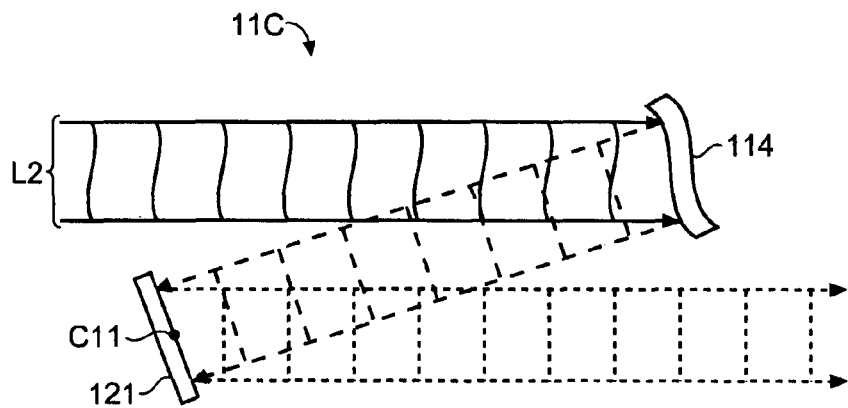
FIG. 18 illustrates a third modification of the beam correction unit according to the first embodiment.

The beam correction unit 11 may be modified as shown in FIG. 18. A beam correction unit 11C shown in FIG. 18 may include a deformable mirror 114 and the high-reflection mirror 121. The beam correction unit 11C may achieve functions of both a wavefront correction part and a beam direction correction part. That is, the main pulse laser beam L2 incident on the beam correction unit 11C may first be reflected by the deformable mirror 114. At this point, the wavefront of the main pulse laser beam L2 may be corrected, so that the main pulse laser beam L2 may be collimated. Subsequently, the main pulse laser beam L2 may be reflected by the high-reflection mirror 121, which has a reflective surface that may be swingable in two axial directions. With this, the traveling direction of the main pulse laser beam L2 may be adjusted. The deformable mirror 114 may include a Micromachined Membrane Deformable Mirror (MMDM) or the like, which has a reflective surface having a modifiable curvature as well as modifiable concavities and convexities on the reflective surface. The high-reflection mirror 121 of FIG. 18 may be similar to the high-reflection mirror 121 shown in and described in relation to FIG. 13.

1.6 Fourth Modification of Beam Correction Unit

Figure 19:
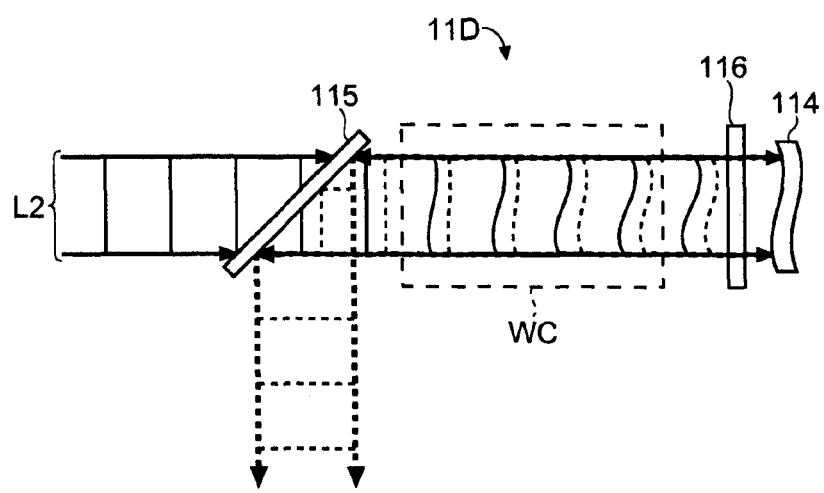
FIG. 19 illustrates a fourth modification of the beam correction unit according to the first embodiment.

The beam correction unit 11 may be modified as shown in FIG. 19. A beam correction unit 11D illustrated in FIG. 19 may be a polarization type beam correction unit, which may include a beam splitter 115, the deformable mirror 114, and a quarter-wave plate 116. The beam correction unit 11D may achieve functions of both a wavefront correction part and a beam direction correction part. The beam splitter 115 may be disposed upstream from an optical system at which changes in the wavefront may occur (wavefront change generation part WC). The deformable mirror 114 may be disposed downstream from the wavefront change generation part WC. The quarter-wave plate 116 may be disposed between the wavefront change generation part WC and the deformable mirror 114. When the main pulse laser beam L2 is incident on the beam splitter 115 of such beam correction unit 11D as a p-polarized laser beam, the main pulse laser beam L2 may be transmitted through the beam splitter 115. Then, the main pulse laser beam L2 may undergo a change in the wavefront when passing through the wavefront change generation part WC. Thereafter, the main pulse laser beam L2 may be transmitted through the quarter-wave plate 116, to thereby be converted into a circularly polarized laser beam. The main pulse laser beam L2 may then be reflected by the deformable mirror 114. At this point, the reflective surface of the deformable mirror 114 may be adjusted such that the wavefront of the laser beam reflected thereby may match the wavefront of the main pulse laser beam L2 incident thereon. Subsequently, the main pulse laser beam L2 may again be transmitted through the quarter-wave plate 116, whereby the polarization direction thereof may be converted such that the main pulse laser beam L2 is incident on the beam splitter 115 as an s-polarized laser beam. Then, the main pulse laser beam L2 may again pass through the wavefront change generation part WC, whereby the change in the wavefront thereof, to which the main pulse laser beam L2 has been subjected when it has passed the wavefront change generation part WC previously, may be cancelled. Thereafter, the main pulse laser beam L2 may be reflected by the beam splitter 115, to thereby be outputted from the beam correction unit 11D.

1.7 Beam Parameter Control

Figure 20:
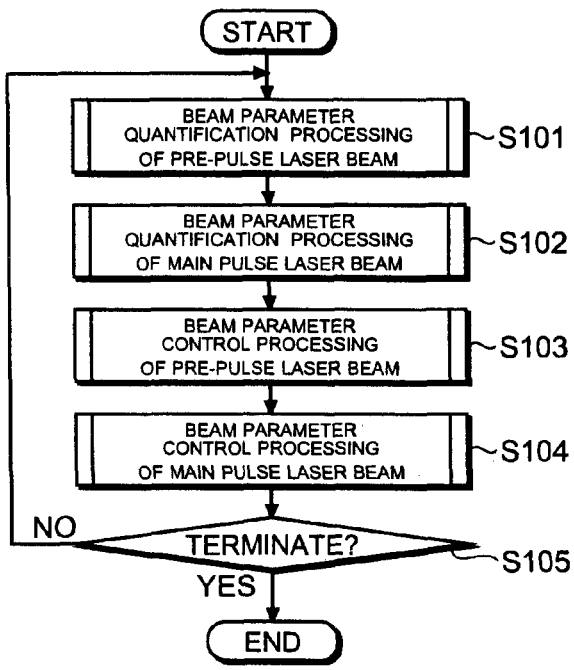
FIG. 20 generally shows a flow of beam parameter control according to the first embodiment.

The beam parameter control according to the first embodiment will be described in detail with reference to the drawings. FIG. 20 shows a general flow of the beam parameter control according to the first embodiment. In the description to follow, operation of the laser controller 105 shown in FIG. 1 will be described.

As shown in FIG. 20, in the beam parameter control, the laser controller 105 may first execute beam parameter quantification processing for quantifying the beam parameter of the pre-pulse laser beam L3 (Step S101). Further, the laser controller 105 may execute beam parameter quantification processing for quantifying the beam parameter of the main pulse laser beam L2 (Step S102). The above beam parameter quantification processing may be executed based on data (beam profile) inputted from the beam parameter measuring unit 103 (See FIG. 1), indicating the beam parameters of the pre-pulse laser beam L3 and of the main pulse laser beam L2.

Subsequently, the laser controller 105 may execute beam parameter control processing for adjusting the beam parameter of the pre-pulse laser beam L3 to a desired beam parameter, based on the result of the beam parameter quantification processing in Step S101 (Step S103). Further, the laser controller 105 may execute beam parameter control processing for adjusting the beam parameter of the main pulse laser beam L2 to a desired beam parameter, based on the result of the beam parameter quantification processing in Step S102 (Step S104).

Thereafter, the laser controller 105 may determine whether or not a request to terminate the operation has been inputted (Step S105). If the request has been inputted (Step S105: YES), the laser controller 105 may terminate the operation shown in FIG. 20. On the other hand, if the request has not been inputted (Step S105: NO), the laser controller 105 may return to Step S101 and execute the operation from that point forward.

1.7.1 Beam Parameter Quantification Processing of Pre-pulse Laser Beam

The beam parameter quantification processing of the pre-pulse laser beam L3 in Step S101 shown in FIG. 20 will be described in detail with reference to FIG. 21. The beam parameter quantification processing of the pre-pulse laser beam L3 may be executed by the beam controller 20 of the pre-pulse laser 102, under the control of the laser controller 105. Thus, the description will be given below with a focus on the beam controller 20.

Figure 21:
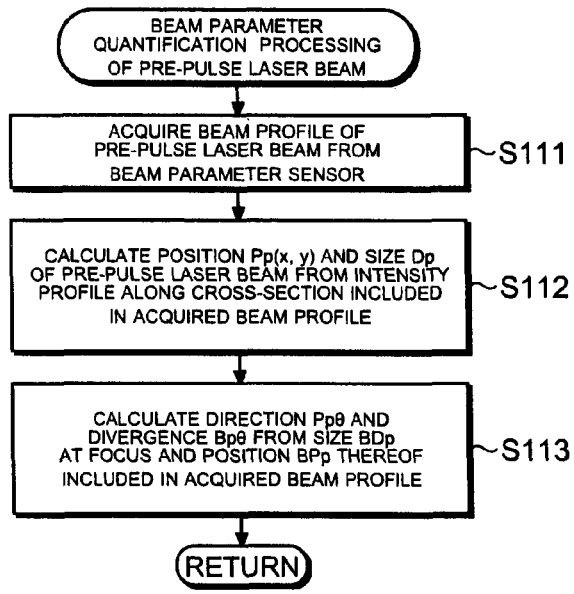
FIG. 21 shows an example of beam parameter quantification processing of a pre-pulse laser beam according to the first embodiment.

As shown in FIG. 21, in the beam parameter quantification processing of the pre-pulse laser beam L3, the beam controller 20 may first acquire the beam profile of the pre-pulse laser beam L3 measured by the beam parameter sensor D32 (See FIG. 1) (Step S111). The beam profile here may include data such as the intensity profile along a cross-section of the laser beam, the divergence and the traveling direction of the laser beam, and so forth. However, without being limited thereto, the intensity profiles along cross-sections at two distanced positions along the beam path of the laser beam may also be included.

Then, the beam controller 20 may calculate a position Pp (x, y) of the pre-pulse laser beam L3 from the intensity profile along the cross-section of the pre-pulse laser beam L3 included in the acquired beam profile. At this time, the beam controller 20 may calculate a size Dp of the pre-pulse laser beam L3. Subsequently, the beam controller 20 may calculate a traveling direction Ppθ and divergence Bpθ of the pre-pulse laser beam L3 from a size BDp and a position BPp of the pre-pulse laser beam L3 at the focus thereof included in the acquired beam profile (Step S113). In this way, the position Pp (x, y), the size Dp, the traveling direction Ppθ), and the divergence Bpθ, indicating the beam parameter of the pre-pulse laser beam L3, may be acquired. Here, the (x, y) coordinate indicating the position may be a coordinate with the reference on a plane perpendicular to the traveling direction of the laser beam.

1.7.2 Beam Parameter Quantification Processing of Main Pulse Laser Beam

The beam parameter quantification processing of the main pulse laser beam L2 in Step S102 shown in FIG. 20 will be described in detail with reference to FIG. 22. The beam parameter quantification processing of the main pulse laser beam L2 may be executed by the beam controller 10 of the driver laser 101, under the control on the laser controller 105. Thus, the description will be given below with a focus on the beam controller 10.

Figure 22:
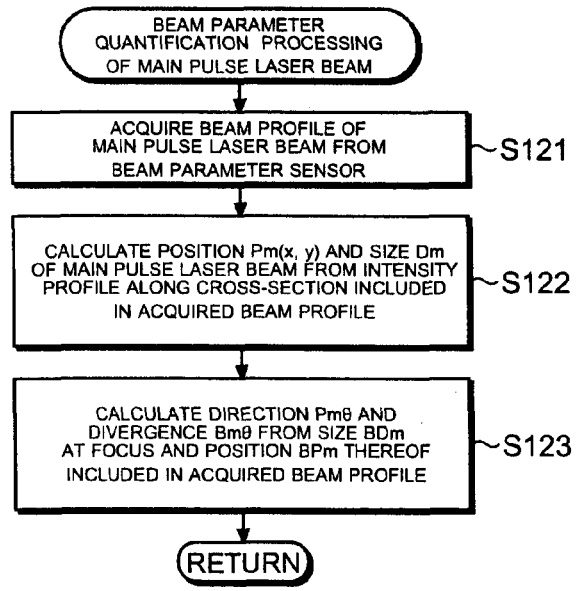
FIG. 22 shows an example of beam parameter quantification processing of a main pulse laser beam according to the first embodiment.

As illustrated in FIG. 22, in the beam parameter quantification processing of the main pulse laser beam L2, the beam controller 10 may first acquire the beam profile of the main pulse laser beam L2 measured by the beam parameter sensor D31 (See FIG. 1) (Step S121). The beam profile may include data such as the intensity profile along the cross-section of the laser beam, the divergence and the traveling direction of the laser beam, and so forth, for example. However, without being limited thereto, the intensity profiles along cross-sections at two distanced positions along the beam path of the laser beam may also be included.

Then, the beam controller 10 may calculate a position Pm (x, y) of the main pulse laser beam L2 from the intensity profile along the cross-section of the main pulse laser beam L2 included in the acquired beam profile (Step S122). At this time, the beam controller 10 may calculate a size Dm of the main pulse laser beam L2. Subsequently, the beam controller 10 may calculate a traveling direction Pmθ and divergence Bmθ of the main pulse laser beam L2 from a size BDm and a position BPm of the main pulse laser beam L2 at the focus thereof included in the acquired beam profile (Step S123). In this way, the position. Pm (x, y), the traveling direction Pmθ, and the divergence Bmθ indicating the beam parameter of the main pulse laser beam L2 may be acquired.

1.7.3 Beam Parameter Control Processing of Pre-pulse Laser Beam

The beam parameter control processing of the pre-pulse laser beam L3 in Step S103 shown in FIG. 20 will be described in detail with reference to FIG. 23. The beam parameter control processing of the pre-pulse laser beam L3 may be executed by the beam controller 20, under the control of the laser controller 105, as in the beam parameter quantification processing of the pre-pulse laser beam L3. Thus the description will be given below with a focus on the beam controller 20.

Figure 23:
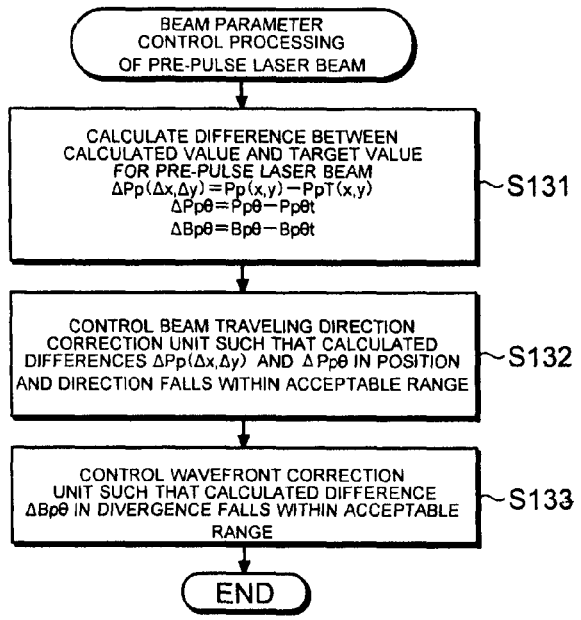
FIG. 23 shows an example of beam parameter control processing of the pre-pulse laser beam according to the first embodiment.

As shown in FIG. 23, in the beam parameter control processing of the pre-pulse laser beam L3, the beam controller 20 may first calculate a difference between a value calculated in the beam parameter quantification processing of the pre-pulse laser beam L3 and a target value pre-set for the pre-pulse laser beam L3 (Step S131). The value calculated in the beam parameter quantification processing of the pre-pulse laser beam L3 may include the position Pp (x, y), the traveling direction Ppθ, and the divergence Bpθ. The target value pre-set for the pre-pulse laser beam L3 may include target values for the position, the traveling direction, and the divergence. The target value for the divergence may include a target position PpT (x, y), a target traveling direction Ppθt, and target divergence Bpθt. In this case, the calculated difference may include a difference ΔPp (Δx, Δy) in position, a difference ΔPpθ in traveling direction, and a difference ΔBpθ in divergence.

Subsequently, the beam controller 20 may control the beam direction correction part 120 in the beam correction unit 21 (Step S132). With this, the calculated differences (ΔPp (Δx, Δy) and ΔPpθ) in position and in traveling direction, respectively, may be adjusted so as to fall within pre-set acceptable ranges, respectively. Here, the beam direction correction part 120 may be controlled with sequence control, feed-back control, feed-forward control, PID control, or the like.

Then, the beam controller 20 may control the wavefront correction part 110 of the beam correction unit 21 such that calculated the difference (ΔBpθ) in divergence falls within a pre-set acceptable range (Step S133). Here, the wavefront correction part 110 may be controlled with sequence control, feed-back control, feed-forward control, PID control, or the like, as in the beam direction correction part 120. In this way, the control processing may be executed so that the beam parameter of the pre-pulse laser beam L3 is adjusted to a predetermined beam parameter.

1.7.4 Beam Parameter Control Processing of Main Pulse Laser Beam

The beam parameter control processing of the main pulse laser beam L2 in Step S104 shown in FIG. 20 will be described in detail with reference to FIG. 24. The beam parameter control processing of the main pulse laser beam L2 may be executed by the beam controller 10, under the control of the laser controller 105, as in the beam parameter quantification processing of the main pulse laser beam L2. Thus, the description will be given below with a focus on the beam controller 10.

Figure 24:
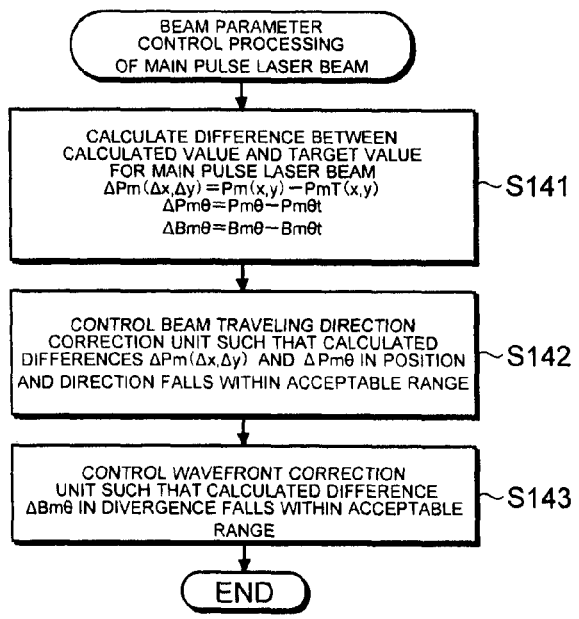
FIG. 24 shows an example of beam parameter control processing of the main pulse laser beam according to the first embodiment.

As shown in FIG. 24, in the beam parameter control processing of the main pulse laser beam L2, the beam controller 10 may first calculate a difference between a value calculated in the beam parameter quantification processing of the main pulse laser beam L2 and a target value pre-set for the main pulse laser beam L2 (Step S141). The value calculated in the beam parameter quantification processing of the main pulse laser beam L2 may include the position Pm (x, y), the traveling direction Pmθ, and the divergence Bmθ. The target value pre-set for the main pulse laser beam L2 may include target values for the position, the traveling direction, and the divergence. The target value for the divergence may include a target position PmT (x, y), a target traveling direction Pmθt, and target divergence Bmθt. In this case, the calculated difference may include a difference ΔPm (Δx, Δy) in position, a difference ΔPmθ in traveling direction, and a difference ΔBmθ in divergence.

Subsequently, the beam controller 10 may control the beam direction correction part 120 in the beam correction unit 11 (Step S142). With this, the differences (ΔPm (Δx, Δy) and ΔPmθ) in position and in traveling direction may be adjusted so as to fall within pre-set acceptable ranges, respectively. Here, the beam direction correction part 120 may be controlled with sequence control, feed-back control, feed-forward control, PID control, or the like.

Then, the beam controller 10 may control the wavefront correction part 11D of the beam correction unit 11 such that the calculated difference (ΔBmθ) in divergence falls within the pre-set acceptable range (Step S143). Here, the wavefront correction part 110 may be controlled with sequence control, feed-back control, feed-forward control, PID control, or the like, as in the beam direction correction part 120. In this way, the control processing may be executed so that the beam parameter of the main pulse laser beam L2 is adjusted to a predetermined beam parameter.

As has been described so far, in the first embodiment, beam parameters of the main pulse laser beam L2 and the pre-pulse laser beam L3 may respectively be measured and quantified, and the beam parameters of the respective laser beams may be controlled based on the results thereof. This may make it possible to adjust the laser beams, respectively, to a laser beam having a desired beam parameter with high precision. Further, in the first embodiment, the beam paths of the pre-pulse laser beam L3 and the main pulse laser beam L2 may be adjusted by the dichroic mirror such that at least parts of the respective beam paths overlap with each other spatially. This may make it possible to dispose the beam parameter sensor D32 for the pre-pulse laser beam L3 and the beam parameter sensor D31 for the main pulse laser beam L2 compactly. This in turn may make it possible to modularize the beam parameter measuring unit 103 or to reduce the beam parameter measuring unit 103 and the EUV light generation system 100 in size.

Further, in the first embodiment, a common focusing optical system may be used for both the pre-pulse laser beam L3 and the main pulse laser beam L2. With this, a space occupied with the focusing optical system may be reduced. This in turn may facilitate the general design of the EUV light generation system. Further, the focusing optical system being shared, the number of components constituting the system may be reduced; thus, the manufacturing cost may be reduced.

Further, in the first embodiment, the beam parameter sensors D31 and D32 and the beam splitter B31 may be implemented as an integrated module, which may facilitate adjustment and replacement of the beam parameter measuring unit.

Further, in the first embodiment, the wavefront of the pre-pulse laser beam L3 may be detected by the beam parameter sensor D32, and the high-reflection mirror 221 and the deformable mirror 211 may be controlled such that the traveling direction of the laser beam remains in a desired direction. With this, the pre-pulse laser beam L3 may strike the droplets D stably. Similarly, the wavefront of the main pulse laser beam L2 may be detected by the beam parameter sensor D31, and the high-reflection mirror 121 and the deformable mirror 111 may be controlled such that the traveling direction of the laser beam remains in a desired direction. With this, the main pulse laser beam L2 may strike the diffused target material stably.

In particular, controlling the wavefront of the high-power main pulse laser beam L2 may be important in retaining its stability. The higher laser controller 105 may integrally control the oscillation timing and output of the driver laser 101 and of the pre-pulse laser 102, and the wavefront of the laser beams outputted from the respective lasers.

Second Embodiment

Figure 25:
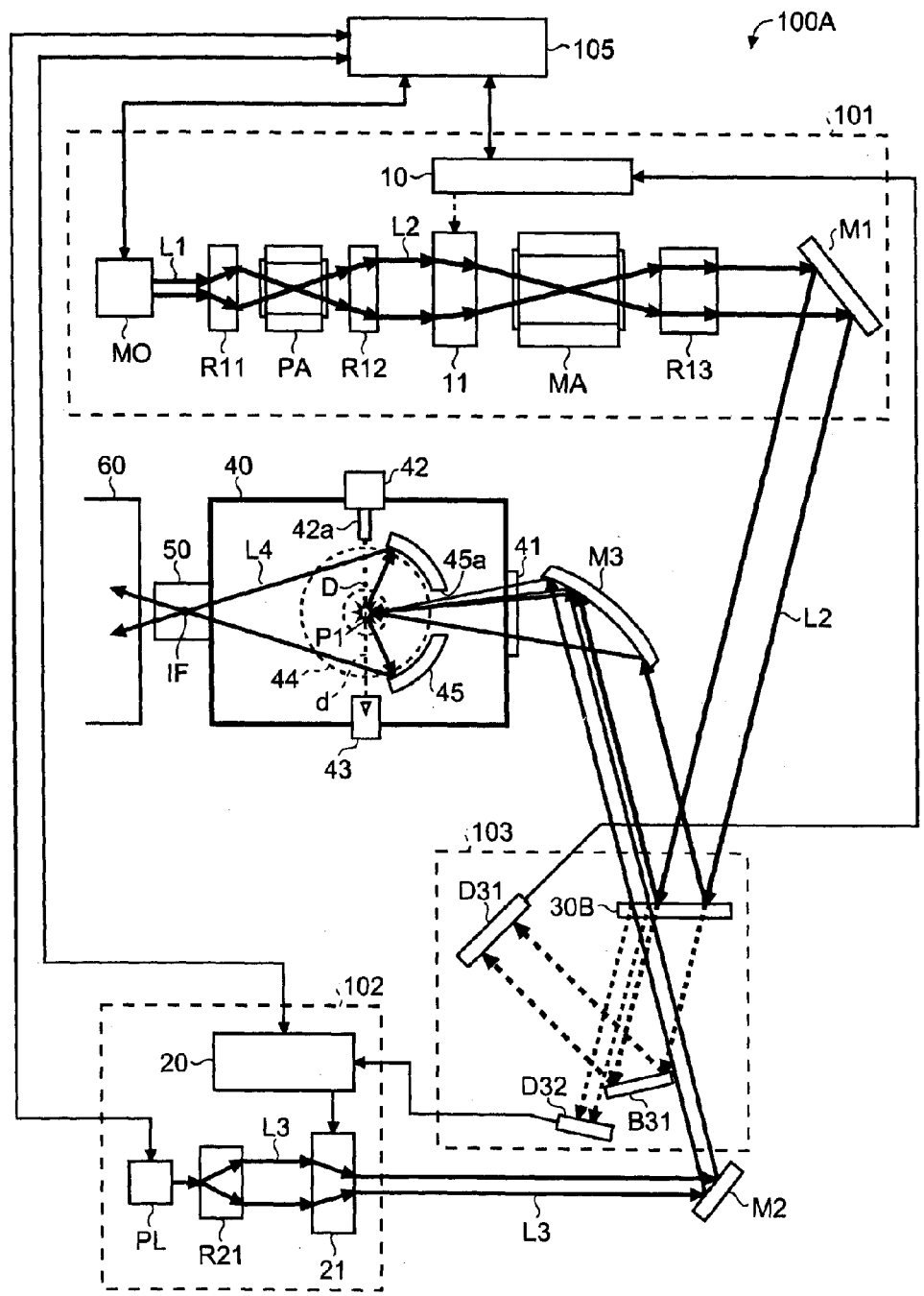
FIG. 25 schematically illustrates the configuration of an EUV light generation system according to a second embodiment of this disclosure.

A second embodiment of this disclosure will be described in detail with reference to the drawings. FIG. 25 schematically illustrates the configuration of an EUV light generation system according to the second embodiment. As may be apparent when compared to the EUV light generation system shown in FIG. 1, in an EUV light generation system 100A shown in FIG. 25, the dichroic mirror 30 in the beam parameter measuring unit 103 of the EUV light generation system 100 may be replaced by a mirror 30B.

Figure 26:
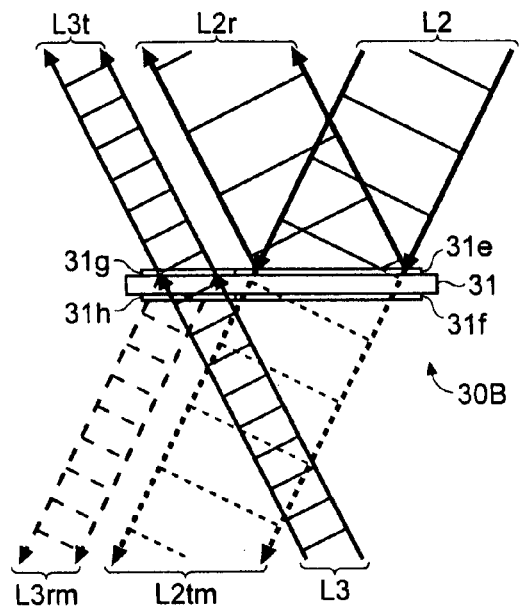
FIG. 26 illustrates an example of a beam path adjusting part according to the second embodiment.

FIG. 26 illustrates an example of a mirror according to the second embodiment. The mirror 30B may include the planar diamond substrate 31, for example, as in the dichroic mirror 30. The diamond substrate 31 may have, in one region of one principal surface thereof, a thin film coating 31e formed thereon, the thin film coating 31e having high reflectivity for the main pulse laser beam L2. The diamond substrate 31 may have, in the remaining region of the one surface, a thin film coating 31g formed thereon, the thin film coating 31g having high transmissivity for the pre-pulse laser beam L3. Meanwhile, the diamond substrate 31 may have, in a region of the other principal surface thereof corresponding to the thin film 31e (e.g., a region of the other principal surface that directly faces the thin film 31e), an anti-reflection thin film coating 31f formed thereon, the anti-reflection thin film coating 31f having high transmissivity for the main pulse laser beam L2. The diamond substrate 31 may have, in the remaining region of the other principal surface thereof corresponding to the thin film coating 31g (e.g., a region of the other principal surface that directly faces the thin film 31g), an anti-reflection thin film coating 31h formed thereon, the anti-reflection thin film coating 31h having high transmissivity for the pre-pulse laser beam L3. In some examples, the thin film coatings 31f and 31h are coatings configured to suppress reflection of the main and pre-pulse laser beams L2 and L3 with high efficiency.

The direction in which the main pulse laser beam L2 travels may be controlled such that the main pulse laser beam L2 may be incident on the region in which the thin film coating 31e is formed on the one principal surface of the mirror 30B. The direction in which the pre-pulse laser beam L3 travels may be controlled such that the pre-pulse laser beam L3 may be incident on the region in which the anti-reflection thin film coating 31h is formed on the other principal surface of the mirror 30B. Angles at which the main pulse laser beam L2 and the pre-pulse laser beam L3 are incident on the mirror 30B, respectively, may be adjusted so as to satisfy the following conditions (e) and (f).

(e) The direction in which the reflected beam L2r of the main pulse laser beam L2 travels and the direction in which the transmitted beam L3t of the pre-pulse laser beam L3 travels are substantially parallel to each other.

(f) The direction in which the transmitted beam L2tm of the main pulse laser beam L2 travels and the direction in which the reflected beam L3rm of the pre-pulse laser beam L3 travels are substantially parallel to each other.

The transmitted beam L3t and the reflected beam L2r, which have traveling directions (or propagation directions) that are parallel to each other, may be reflected by the off-axis paraboloidal concave mirror M3, to thereby be focused in the plasma generation region P1 inside the chamber 40.

In this way, the mirror 30B can be configured such that laser beams at different wavelengths are reflected by or transmitted through the mirror 30B at different regions thereof depending on the region on which a laser beam is incident, the pre-pulse laser beam L3 and the main pulse laser beam L2 may both be focused in the plasma generation region inside the chamber 40. Other configurations, operations, and effects may be similar to those of the first embodiment or the modifications thereof; thus, detailed description thereof will be omitted here.

2.1 Modification of Beam Path Adjusting Part

Figure 27:
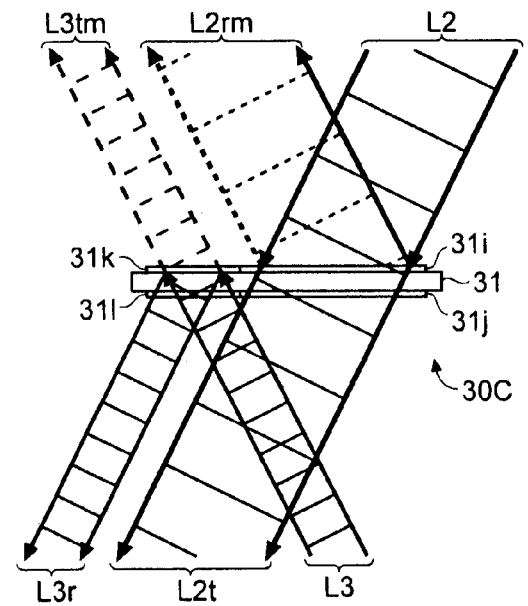
FIG. 27 illustrates a modification of the beam path adjusting part according to the second embodiment.

The beam path adjusting part may include a mirror 30C shown in FIG. 27. The mirror 30C may be configured such that the diamond substrate 31 constituting the mirror 30C may have, in one region of one principal surface thereof, a thin film coating 31i formed thereon, the thin film coating 31i having high transmissivity for the main pulse laser beam L2. The diamond substrate 31 may have, in the remaining region of the one principal surface thereof, a thin film coating 31k formed thereon, the thin film coating 31k having high reflectivity for the pre-pulse laser beam L3. Meanwhile, the diamond substrate 31 may have, in one region of the other principal surface thereof corresponding to the thin film coating 31i (e.g., a region of the other principal surface that directly faces the thin film coating 31i), an anti-reflection thin film coating 31j formed thereon, the anti-reflection thin film coating 31j having high transmissivity for the main pulse laser beam L2. The diamond substrate 31 may have, in the other region of the other principal surface thereof corresponding to the thin film coating 31k (e.g., a region of the other principal surface that directly faces the thin film coating 31k), an anti-reflection thin film coating 31l formed thereon, the anti-reflection thin film coating 31j having high transmissivity for the pre-pulse laser beam L3. In some examples, the thin film coatings 31j and 31l are coatings configured to suppress reflection of the main and pre-pulse laser beams L2 and L3 with high efficiency.

The direction in which the main pulse laser beam L2 travels may be controlled such that the main pulse laser beam L2 may be incident on the region in which the thin film coating 31i is formed on the one principal surface of the mirror 30C. The direction in which the pre-pulse laser beam L3 travels may be controlled such that the pre-pulse laser beam L3 may be incident on the region in which the anti-reflection thin film coating 31l is formed on the other principal surface of the mirror 30C. Angles at which the main pulse laser beam L2 and the pre-pulse laser beam L3 are incident on the mirror 30C, respectively, may be adjusted so as to satisfy the following conditions (g) and (h).

(g) The direction in which the reflected beam L2rm of the main pulse laser beam L2 travels and the direction in which the transmitted beam L3tm of the pre-pulse laser beam L3 travels are substantially parallel to each other.

(h) The direction in which the transmitted beam L2t of the main pulse laser beam L2 travels and the direction in which the reflected beam L3r of the pre-pulse laser beam L3 travels are substantially parallel to each other.

The reflected beam L3r and the transmitted beam L2t, which have traveling directions (or propagation directions) that are parallel to each other, may respectively be reflected by the off-axis paraboloidal concave mirror M3, to thereby be focused in the plasma generation region P1 inside the chamber 40.

Third Embodiment

Figure 28:
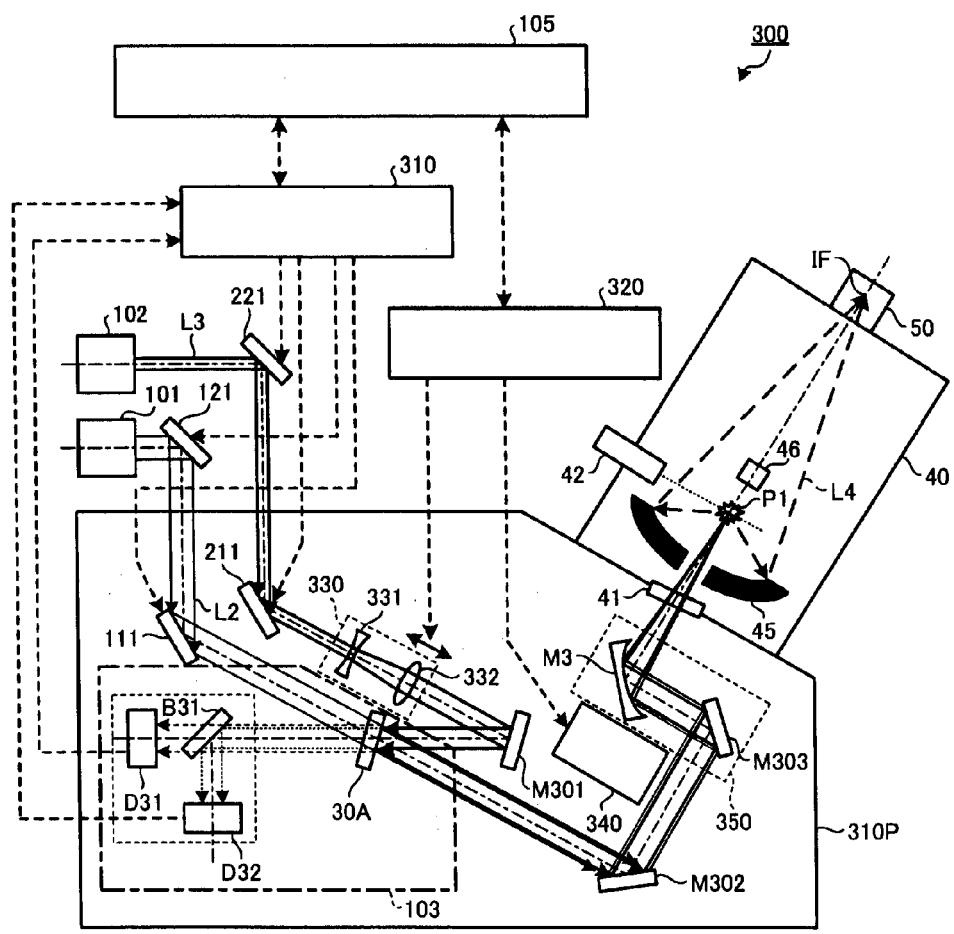
FIG. 28 schematically illustrates the configuration of an EUV light generation system according to a third embodiment of this disclosure.

A third embodiment of this disclosure will be described in detail with reference to the drawings. FIG. 28 schematically illustrates the configuration of an EUV light generation system according to the third embodiment. In the third embodiment, the dichroic mirror 30A shown in FIG. 3 is used as the beam path adjusting part in the beam parameter measuring unit 103. The teachings of the third embodiment, however, are not limited to the particular examples shown in FIGS. 28-30 and can more generally be used in other embodiments and devices.

As may be apparent when FIG. 28 is compared to FIG. 1, an EUV light generation system 300 may be similar in configuration to the EUV light generation system 100 shown in FIG. 1, and may further include a focus adjusting unit 330 and a stage 350. Further, in the third embodiment, the beam controllers 10 and 20 in FIG. 1 may be replaced by a single beam controller 310. The beam correction unit 111 of the driver laser 101 may be disposed outside the driver laser 101. The beam correction unit 211 of the pre-pulse laser 102 may be disposed outside the pre-pulse laser 102.

The focus adjusting unit 330 may include a biconcave lens 331, a collimator lens 332, and an actuator (not shown). The actuator may be configured to adjust the distance between the biconcave lens 331 and the collimator lens 332. In the focus adjusting unit 330, the actuator may be actuated under the control of a focus controller 320. The actuator may be actuated to adjust the distance between the biconcave lens 331 and the collimator lens 332, whereby the pre-pulse laser beam L3 may be focused at a position offset from the focus of the main pulse laser beam L2.

The pre-pulse laser beam L3 outputted from the focus adjusting unit 330 may be reflected by the high-reflection mirror M301. The reflected pre-pulse laser beam L3 may be incident on the dichroic mirror 30A of the beam parameter measuring unit 103. The high-reflection mirror M301 and/or the dichroic mirror 30A may be adjusted such that the direction in which the pre-pulse laser beam L3 travels is parallel to the direction in which the main pulse laser beam L2 travels.

The main pulse laser beam L2 and the pre-pulse laser beam L3, which have traveling directions that are parallel to each other, may then be incident on the off-axis paraboloidal mirror M3 via the high-reflection mirrors M302 and M303. The high-reflection mirror 303 and the off-axis paraboloidal mirror M3 may be anchored to the stage 350, which may be transitionally movable in three axial directions. The stage 350 may be provided with a stage moving unit 340 for transitionally moving the stage 350 in three axial directions. The stage moving unit 340 may move the off-axis paraboloidal mirror M3 under the control of the focus controller 320. The position of the off-axis paraboloidal mirror M3 may be moved to adjust the focuses of the main pulse laser beam L2 and of the pre-pulse laser beam L3 inside the chamber 40.

In the above configuration, the laser controller 105 may be configured to first adjust the focus adjusting unit 330 via the focus controller 320. The laser controller 105 may be used to adjust an offset amount in the focus positions of the pre-pulse laser beam L3 and of the main pulse laser beam L2 to a desired amount. Then, the laser controller 105 may be configured to adjust the stage 350 such that the pre-pulse laser beam L3 may be focused on the droplet D in the plasma generation region P1. Here, the focus of the main pulse laser beam L2 may be set to a position at which the main pulse laser beam L2 may appropriately strike the target material diffused as it is irradiated by the pre-pulse laser beam L3. The droplet D may be a tin droplet and be approximately 10 μm in diameter. The frequency at which the droplets D are supplied may be around 100 kHz or so, for example, which may be a frequency that is proximate to the output frequency of the pre-pulse laser beam L3 and of the main pulse laser beam L2.

Subsequently, under the control of the laser controller 105, the diffused target material may be irradiated by the main pulse laser beam L2. The main pulse laser beam L2 may irradiate the diffused target material to turn the target material into plasma. The target material, which may be diffused in a direction orthogonal to the direction in which the pre-pulse laser beam L3 travels, may be irradiated by the main pulse laser beam L2 in the same direction as the pre-pulse laser beam L3. The focus of the main pulse laser beam L2 may be adjusted such that the target material diffused in disc-shape may be irradiated by the main pulse laser beam L2 across an entire surface thereof, which may lead to an improvement in conversion efficiency (CE).

In the third embodiment, the beam parameter measuring unit 103, parts (111, 211) of the respective beam correction units 11 and 21, the focus adjusting unit 330, the high-reflection mirrors M301 and M302, the stage 350, and the stage moving unit 340 may be provided, for example. These may be contained inside an anterior chamber 310P connected to the chamber 40. The beam parameter measuring unit 103 may include the dichroic mirror 30A, the beam splitter B31, and the beam parameter sensors D31 and D32. The anterior chamber 310P and the chamber 40 may be optically connected to each other while being divided spatially. Other configurations, operations, and effects may be similar to those of the first or second embodiment or the modifications thereof; thus, duplicate descriptions thereof will be omitted here.

3.1 First Modification of Third Embodiment

Figure 29:
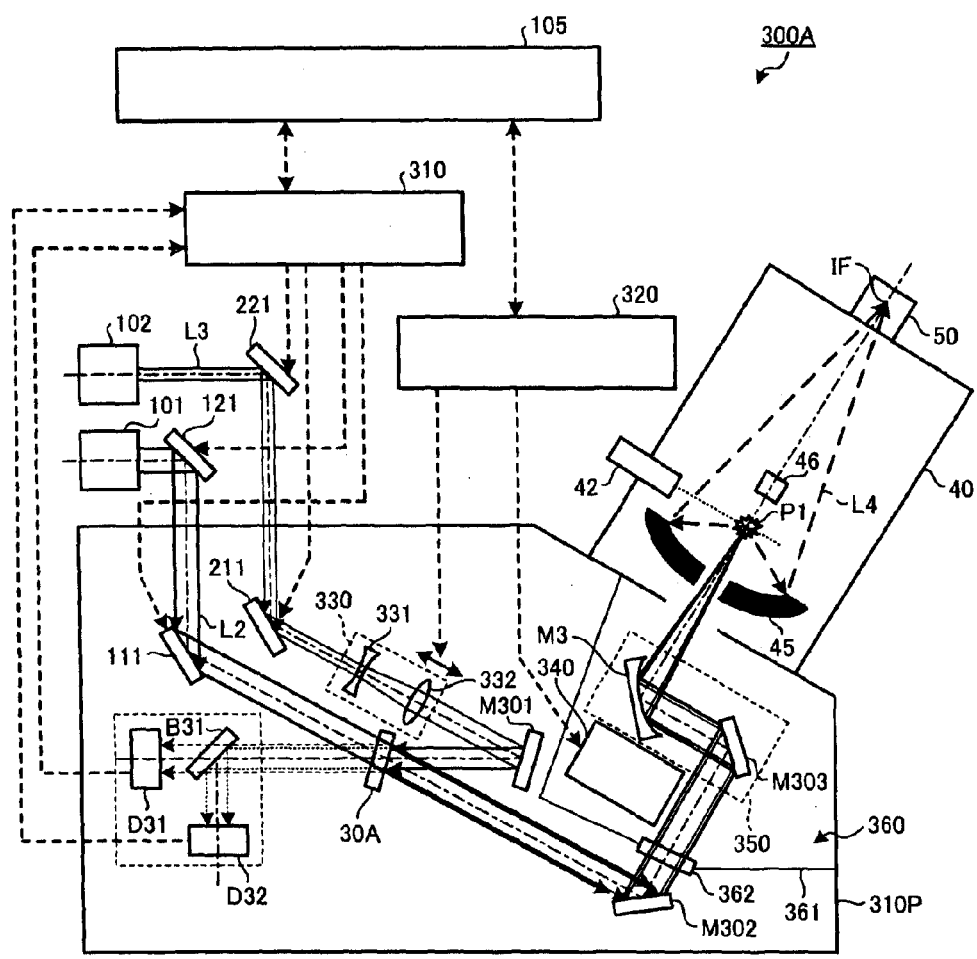
FIG. 29 illustrates a first modification of the EUV light generation system according to the third embodiment.

FIG. 29 illustrates a first modification to the third embodiment. As illustrated in FIG. 29, a booth 360 defined by a partition wall 361 may be provided inside the anterior chamber 310P of an EUV light generation system 300A. The stage 350 and the stage moving unit 340 may, for example, be disposed inside the booth 360. The partition wall 361 may be provided with a window 362, through which the laser beams (L2, L3) reflected by the high-reflection mirror M302 may be introduced into the booth 360. The booth 360 may be provided with a connection at which the anterior chamber 310P is connected to the chamber 40. If this is the case, the window 41 disposed between the chamber 40 and the anterior chamber 310P may be omitted.

The booth 360 may be provided with a connection at which the anterior chamber 310P is connected to the chamber 40, and the partition wall 361 may be provided with the window 362. With this, the window 362, for physically isolating the chamber 40 from the outer space, may be substantially distanced from a region (plasma generation region P1) in which debris of the target material may be generated. As a result, less debris may adhere to the window 362 than to a window 41 (as shown in FIG. 28).

3.2 Second Modification of Third Embodiment

Figure 30:
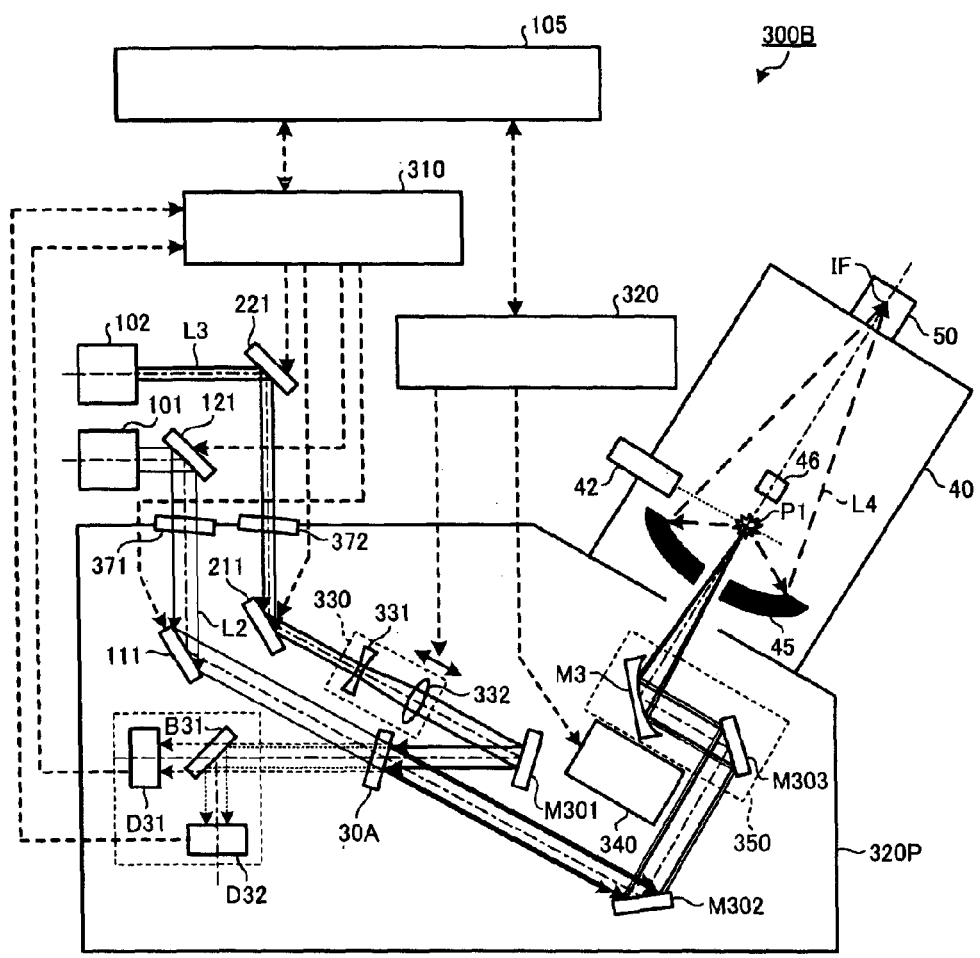
FIG. 30 illustrates a second modification of the EUV light generation system according to the third embodiment.

FIG. 30 illustrates a second modification to the third embodiment. As illustrated in FIG. 30, in an EUV light generation system 300B, the configuration may be such that an anterior chamber 320P may be physically isolated, in its entirety, from the outer space. Accordingly, the anterior chamber 320P may be provided with a window 372, through which the pre-pulse laser beam L3 may be introduced from outside, and a window 371, through which the main pulse laser beam L2 may be introduced from outside.

Such configuration may make it possible to distance the windows for physically isolating the chamber 40 and the anterior chamber 320P from the outer space from the region (plasma generation region P1) in which the debris of the target material may be generated. As a result, less debris may adhere to the windows 371 and 372 than to a window 41 (as shown in FIG. 28).

4. Fourth Embodiment

Figure 31:
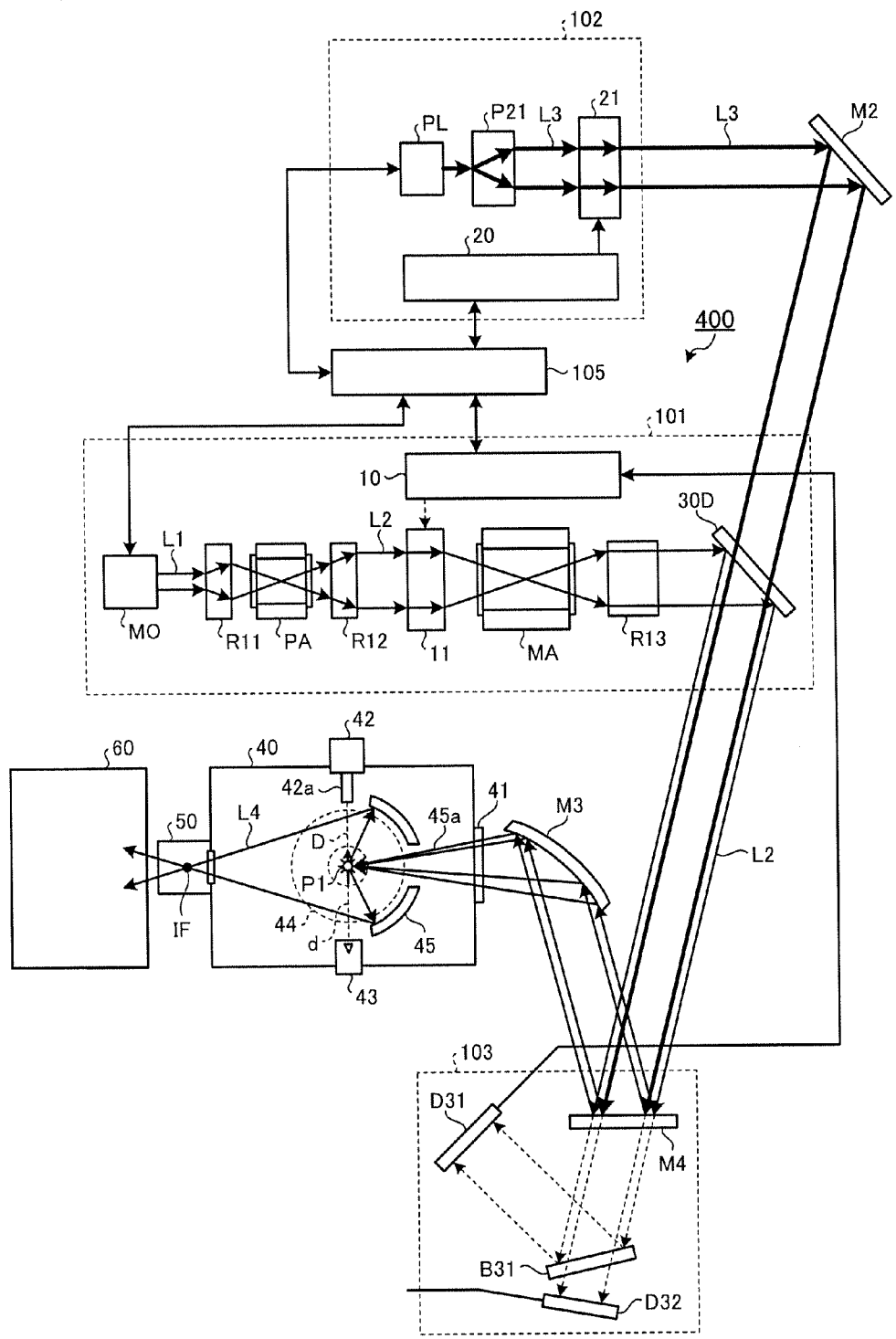
FIG. 31 schematically illustrates the configuration of an EUV light generation system according to a fourth embodiment of this disclosure.

A fourth embodiment of this disclosure will be described in detail with reference to the drawings. FIG. 31 schematically illustrates the configuration of an EUV light generation system according to the fourth embodiment. In the fourth embodiment, a dichroic mirror 30D is used in place of the dichroic mirror 30 of the first embodiment. The teachings of the fourth embodiment, however, are not limited to the particular example shown in FIG. 31 and can more generally be used in other embodiments and devices.

As may be apparent when FIG. 31 is compared to FIG. 1, an EUV light generation system 400 may be configured similarly to the EUV light generation system 100 shown in FIG. 1, except in that the dichroic mirror 30D is disposed at the output part of the driver laser 101. Further, in accordance with this, the mirror M4 may be disposed inside the beam parameter measuring unit 103. The dichroic mirror 30D may be configured similarly to and may achieve a similar function to the dichroic mirror 30. The substrate of the mirror M4 may be a planar diamond substrate. Further, the mirror M4 may have, on one principal surface thereof, a coating formed thereon, the coating having high reflectivity for both the main pulse laser beam L2 and the pre-pulse laser beam L3. The coating may preferably have predetermined transmissivity for both the main pulse laser beam L2 and the pre-pulse laser beam L3. Further, the mirror M4 may have, on the other principal surface thereof, an anti-reflection coating formed thereon, the anti-reflection coating having high transmissivity for both the main pulse laser beam L2 and the pre-pulse laser beam L3.

Angles at which the pre-pulse laser beam L3 and the main pulse laser beam L2 are incident respectively on the dichroic mirror 30D may be adjusted such that the directions of the beam of the pre-pulse laser beam L3 transmitted through the dichroic mirror 30D and of the beam of the main pulse laser beam L2 reflected by the dichroic mirror 30D substantially coincide with each other, and at least parts of the beam paths thereof overlap spatially with each other. The detail of the adjustment of the angles may be similar to that of the first embodiment. The transmitted beam of the pre-pulse laser beam L3 and the reflected beam of the main pulse laser beam L2 may be reflected by the mirror M4 and be introduced into the chamber 40 via the off-axis paraboloidal mirror M3. The transmitted beams of the pre-pulse laser beam L3 and of the main pulse laser beam L2 through the mirror M4 may be incident on the beam parameter measuring part of the beam parameter measuring unit 103. Other configurations, operations, and effects may be similar to those of the first embodiment.

Fifth Embodiment

A fifth embodiment of this disclosure will be described in detail with reference to the drawings. In the description to follow, components similar to the above-described components will be referenced by similar referential symbols, and duplicate descriptions thereof will be omitted here.

Figure 32:
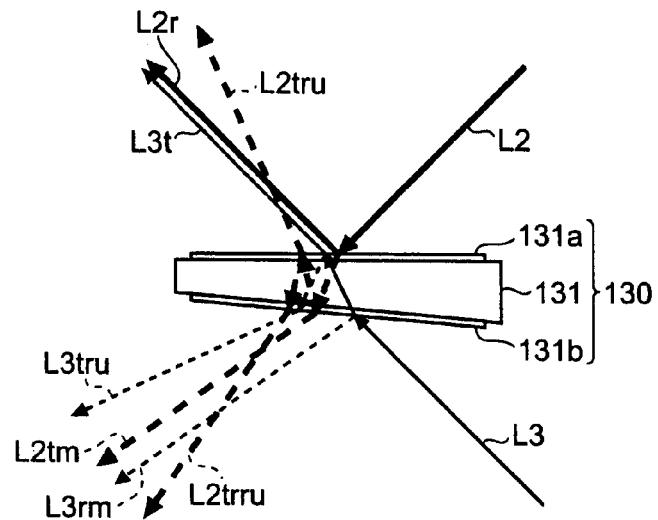
FIG. 32 illustrates an example of a beam path adjusting part according to a fifth embodiment of this disclosure.

FIG. 32 illustrates an example of a beam path adjusting part according to the fifth embodiment. As illustrated in FIG. 32, a beam path adjusting part 130 may include a wedge substrate 131 having two principal surfaces inclined with respect to each other. The wedge substrate 131 may be a diamond substrate, for example. The wedge substrate 131 may have, on one principal surface thereof (hereinafter, referred to as a first surface), a thin film coating 131a formed thereon, the thin film coating 131a having high reflectivity for the main pulse laser beam L2 and high transmissivity for the pre-pulse laser beam L3. In some examples, the thin-film coating 131a may suppress reflection of the pre-pulse laser beam L3 with high efficiency. The wedge substrate 131 may have, on the other principal surface thereof (hereinafter, referred to as a second surface), a thin film coating 131b formed thereon, the thin film coating 131b having high transmissivity for both the main pulse laser beam L2 and the pre-pulse laser beam L3.

The main pulse laser beam L2 may be incident on the first surface of the wedge substrate 131, for example. The main pulse laser beam L2 may be incident on the wedge substrate 131 at an angle inclined toward the thicker portion of the wedge substrate 131, for example (e.g., at an angle to the first surface of the wedge substrate 131 that is acute when measured with respect to the thicker portion of the wedge substrate 131). A large part of the main pulse laser beam L2 may be reflected at the first surface, as the reflected beam L2r. Meanwhile, the pre-pulse laser beam L3 may be incident on the second surface of the wedge substrate 131, for example. The pre-pulse laser beam L3 may be incident on the wedge substrate 131 at an angle inclined toward the thicker portion of the wedge substrate 131, for example (e.g., at an angle to the second surface of the wedge substrate 131 that is acute when measured with respect to the thicker portion of the wedge substrate 131). A large part of the pre-pulse laser beam L3 may be transmitted through the wedge substrate 131, as the transmitted beam L3t. It may be preferable that the axis of the beam path of the reflected beam L2r and the axis of the beam path of the transmitted beam L3t are adjusted to substantially coincide with each other. With this, the main pulse laser beam L2 (reflected beam L2r thereof) and the pre-pulse laser beam L3 (transmitted beam L3t thereof) may be made to enter the chamber 40 along substantially the same beam paths.

The transmitted beam L2tm of the main pulse laser beam L2 transmitted through the wedge substrate 131 may be incident on the beam parameter measuring part, as in FIG. 2. Similarly, the reflected beam L3rm of the pre-pulse laser beam L3 reflected at the second surface of the wedge substrate 131 may be incident on the beam parameter measuring part. Any of the beam parameter measuring parts described above may be used as the beam parameter measuring part here.

Using the wedge substrate 131 may allow the output direction of the transmitted beam L2tm or of the reflected beam L3rm used to measure the beam parameter to be made to differ from the output direction of a multi-reflected beam reflected multiple times inside the wedge substrate 131. Here, "the multi-reflected beam reflected multiple times" may include multi-reflected beams L2trru and L3tru or a multi-reflected beam reflected more times. As a result, fewer unnecessary beams may be incident on the beam parameter measuring part; thus, accuracy and precision with which the beam parameters of the respective laser beams are measured may be improved. Further, the above configuration may allow the output directions of the reflected beam L2r and of the transmitted beam L3t introduced into the chamber 40 to be made to differ from the output direction of the multi-reflected beam (multi-reflected beam L2tru or multi-reflected beam reflected more times, for example) reflected more times than necessary inside the wedge substrate 131. As a result, fewer unnecessary beams may be introduced into the chamber 40.

5.1 Modification of Beam Path Adjusting Part of Fifth Embodiment

Figure 33:
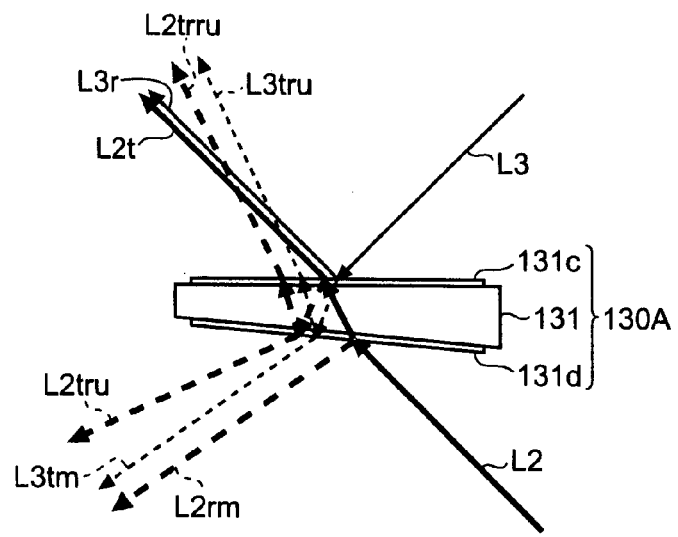
FIG. 33 illustrates a modification of the beam path adjusting part according to the fifth embodiment.

The beam path adjusting part according to the fifth embodiment may be modified as shown in FIG. 33, as well. FIG. 33 illustrates a modification of the beam path adjusting part according to the fifth embodiment. As illustrated in FIG. 33, a beam path adjusting part 130A may include the wedge substrate 131 similar to that shown in FIG. 32. The wedge substrate 131 may have, on one principal surface thereof (a first surface), a thin film coating 131c formed thereon, the thin film coating 131c having high transmissivity for the main pulse laser beam L2 and high reflectivity for the pre-pulse laser beam L3. In some examples, the thin-film coating 131c may suppress reflection of the main pulse laser beam L2 with high efficiency. The wedge substrate 131 may have, on the other principal surface thereof (a second surface), a thin film coating 131d formed thereon, the thin film coating 131d having high transmissivity for both the main pulse laser beam L2 and the pre-pulse laser beam L3.

The pre-pulse laser beam L3 may be incident on the first surface of the wedge substrate 131, for example. The pre-pulse laser beam L3 may be incident on the wedge substrate 131 at an angle inclined toward the thicker portion of the wedge substrate 131, for example (e.g., at an angle to the first surface of the wedge substrate 131 that is acute when measured with respect to the thicker portion of the wedge substrate 131). A large part of the pre-pulse laser beam L3 may be reflected at the first surface, as the reflected beam L3r. Meanwhile, the main pulse laser beam L2 may be incident on the second surface of the wedge substrate 131, for example. The main pulse laser beam L2 may be incident on the wedge substrate 131 at an angle inclined toward the thicker portion of the wedge substrate 131, for example (e.g., at an angle to the second surface of the wedge substrate 131 that is acute when measured with respect to the thicker portion of the wedge substrate 131). A large part of the main pulse laser beam L2 may be transmitted through the wedge substrate 131, as the transmitted beam L2t. It may be preferable that the axis of the beam path of the reflected beam L3r and the axis of the beam path of the transmitted beam L2t are adjusted to substantially coincide with each other. With this, the main pulse laser beam L2 (transmitted beam L2t thereof) and the pre-pulse laser beam L3 (reflected beam L3r thereof) may be made to enter the chamber 40 along substantially the same beam paths.

The transmitted beam L3tm of the pre-pulse laser beam L3 transmitted through the wedge substrate 131 may be incident on the beam parameter measuring part, as in FIG. 3. Similarly, the reflected beam L2rm of the main pulse laser beam L2 reflected at the second surface of the wedge substrate 131 may be incident on the beam parameter measuring part. Any of the beam parameter measuring parts described above may be used as the beam parameter measuring part here.

Using the wedge substrate 131 may allow the output direction of the reflected beam L2rm or of the transmitted beam L3tm used to measure the beam parameter to be made to differ from the output direction of the multi-reflected beam reflected multiple times inside the wedge substrate 131. Here, "the multi-reflected beam reflected multiple times" may include a multi-reflected beam L2tru or a multi-reflected beam reflected more times. As a result, fewer unnecessary beams may be incident on the beam parameter measuring part; thus, accuracy and precision with which the beam parameters of the respective laser beams are measured may be improved. Further, the above configuration may allow the output directions of the transmitted beam L2t and of the reflected beam L3r introduced into the chamber 40 to be made to differ from the output directions of the multi-reflected beams (multi-reflected beams L2trru and L3tru or multi-reflected beams reflected more times, for example) reflected more times than necessary inside the wedge substrate 131. As a result, fewer unnecessary beams may be introduced into the chamber 40.

Figure 34:
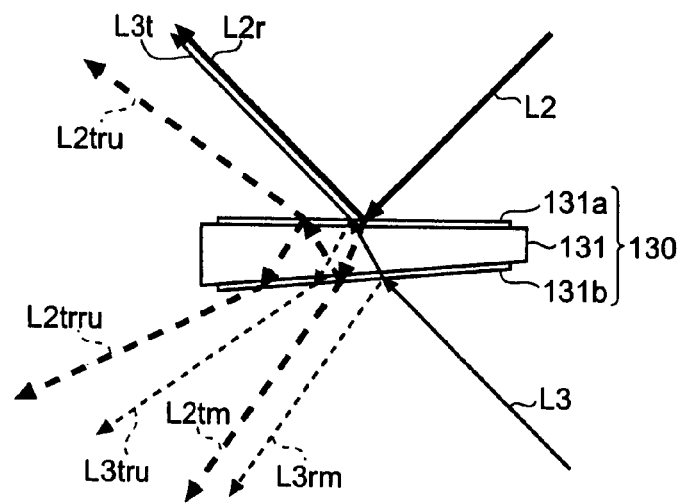
FIG. 34 illustrates the beam path adjusting part shown in FIG. 32 in another mode of use.
Figure 35:
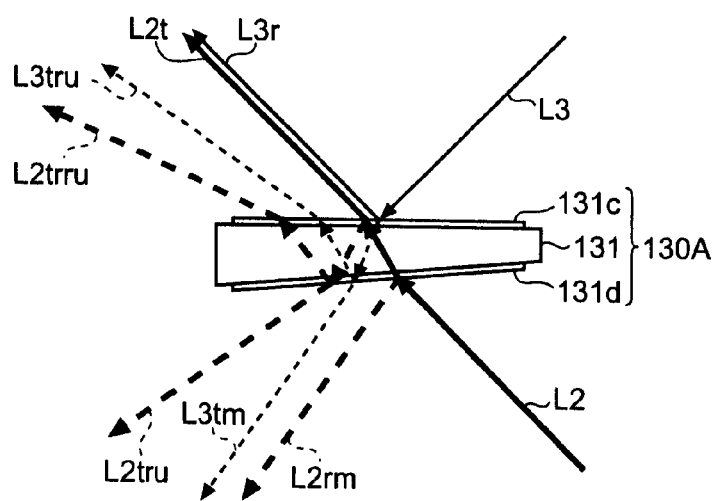
FIG. 35 illustrates the beam path adjusting part shown in FIG. 33 in another mode of use.

The beam path adjusting part 130 shown in FIG. 32 may be configured, as shown in FIG. 34, such that the main pulse laser beam L2 is incident on the first surface of the wedge substrate 131 at an angle inclined toward the thinner portion of the wedge substrate 131 (e.g., at an angle to the first surface of the wedge substrate 131 that is acute when measured with respect to the thinner portion of the wedge substrate 131). Here, the pre-pulse laser beam L3 may be incident on the second surface of the wedge substrate 131 at an angle inclined toward the thinner portion of the wedge substrate 131 (e.g., at an angle to the second surface of the wedge substrate 131 that is acute when measured with respect to the thinner portion of the wedge substrate 131). Similarly, the beam path adjusting part 130A shown in FIG. 33 may be configured, as shown in FIG. 35, such that the pre-pulse laser beam L3 is incident on the first surface of the wedge substrate 131 at an angle inclined toward the thinner portion of the wedge substrate 131 (e.g., at an angle to the first surface of the wedge substrate 131 that is acute when measured with respect to the thinner portion of the wedge substrate 131). Here, the main pulse laser beam L2 may be incident on the second surface of the wedge substrate 131 at an angle inclined toward the thinner portion of the wedge substrate 131 (e.g., at an angle to the second surface of the wedge substrate 131 that is acute when measured with respect to the thinner portion of the wedge substrate 131). Even with such configurations, fewer unnecessary beams may be made incident on the beam parameter measuring part; thus, accuracy and precision with which the beam parameters of the respective laser beams are measured may be improved. Further, fewer unnecessary beams may be introduced into the chamber 40.

5.2 EUV Light Generation System

Figure 36:
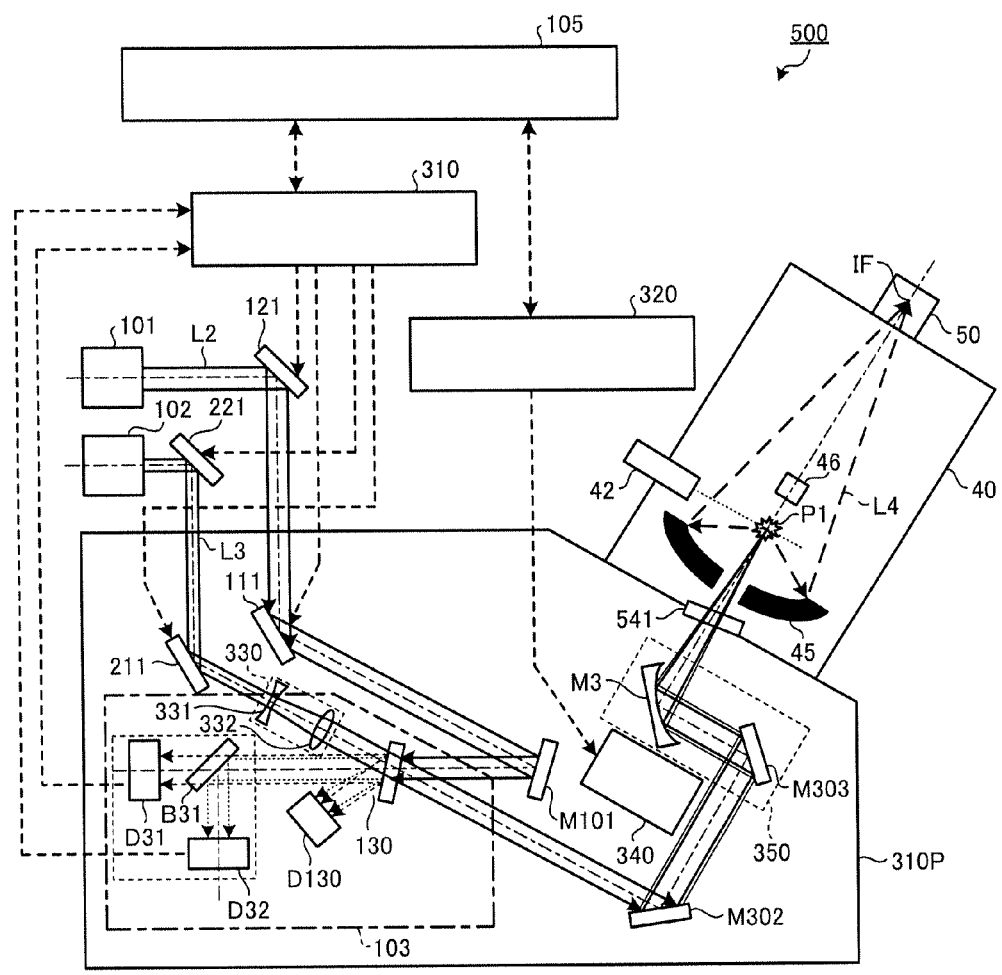
FIG. 36 schematically illustrates the configuration of an EUV light generation system according to the fifth embodiment.

An EUV light generation system including the beam path adjusting part according to the fifth embodiment will be described in detail with reference to the drawings. FIG. 36 schematically illustrates the configuration of the EUV light generation system according to the fifth embodiment. Note that a case where the EUV light generation system includes the beam path adjusting part 130 shown in FIG. 32 will be illustrated below.

As may be apparent when FIG. 36 is compared to FIG. 28, an EUV light generation system 500 may be configured similarly to the EUV light generation system 300 shown in FIG. 28, except in that the beam path adjusting part 130 shown in FIG. 32 may be used for the beam path adjusting part of the beam parameter measuring unit 103, in place of the dichroic mirror 30A. Further, placement of the driver laser 101 and the pre-pulse laser 102 may be switched. That is, the wedge substrate 131 of the beam path adjusting part 130 may be configured to reflect the main pulse laser beam L2 incident thereon so as to introduce the main pulse laser beam L2 into the chamber 40 and to transmit the pre-pulse laser beam L3 incident thereon so as to introduce the pre-pulse laser beam L3 into the chamber 40.

Further, the EUV light generation system 500 may be provided with a beam dump D130 for absorbing unnecessary multi-reflected beams generated by the wedge substrate 131 of the beam path adjusting part 130. The beam dump D130 may be cooled by a cooling system (not shown), for example.

Further, in the EUV light generation system 500, the window 141 disposed at a position at which the anterior chamber 310P is connected optically to the chamber 40 may be replaced by a wedge-shaped window 541. A laser beam transmitted through the wedge substrate 131 may have the beam diameter thereof expanded in some cases. Accordingly, replacing the window 141 by the wedge-shaped window 541 may allow the laser beam, which has been transmitted through the wedge substrate 131 and which a beam diameter that has been expanded, to have the beam diameter thereof corrected. For example, the wedge substrate 131 and the window 541 may be disposed such that a laser beam transmitted therethrough is incident on the upstream wedge substrate at an angle inclined toward the thicker portion thereof and is incident on the downstream wedge substrate at an angle inclined toward the thinner portion thereof. The window 541 may be disposed for preventing the reflected beam reflected by the window 541 or downstream therefrom from traveling upstream.

Other configurations and operations may be similar to those described with reference to FIG. 28; thus, duplicate descriptions thereof will be omitted here.

6. Sixth Embodiment

Figure 37:
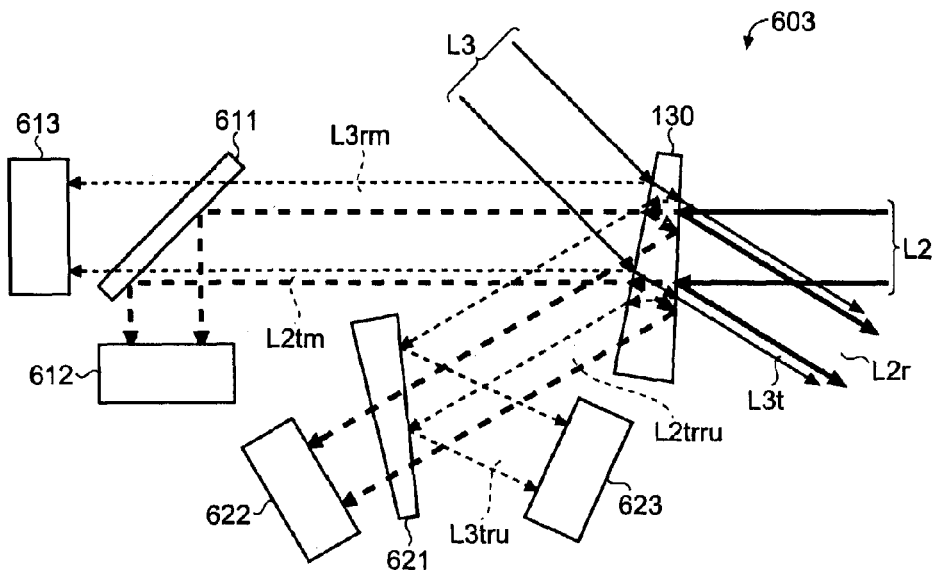
FIG. 37 illustrates an example of a beam parameter measuring unit according to a sixth embodiment of this disclosure.

A sixth embodiment of this disclosure will be described in detail with reference to the drawings. In the sixth embodiment, the multi-reflected beams of the main pulse laser beam L2 and of the pre-pulse laser beam L3 generated in the wedge substrate 131 may be absorbed by the beam dump 130. However, at least part of the multi-reflected beams may be used to measure the beam parameter. FIG. 37 illustrates an example of a beam parameter measuring unit according to the sixth embodiment.

As illustrated in FIG. 37, a beam parameter measuring unit 603 may include the beam path adjusting part 130, a beam splitter 611, wavefront sensors 612 and 613, a wedge substrate 621, and beam profilers 622 and 623. The beam path adjusting part 130 may be configured similarly to the beam path adjusting part shown in FIG. 34. Alternatively, the beam path adjusting part 130 may be replaced by another beam path adjusting part, such as the beam path adjusting part 130A.

The beam splitter 611 may reflect the transmitted beam L2tm of the main pulse laser beam L2 and transmit the reflected beam L3rm of the pre-pulse laser beam L3. The transmitted beam L2tm of the main pulse laser beam L2 reflected by the beam splitter 611 may be incident on the wavefront sensor 612. The wavefront sensor 612 may measure the wavefront of the transmitted beam L2tm as the wavefront of the main pulse laser beam L2. Data on the measured wavefront of the main pulse laser beam L2 may be inputted to the laser controller 105 via the beam controller 310, for example. The laser controller 105 may be configured to actuate the beam controller 310 based on the inputted data on the wavefront of the main pulse laser beam L2, to thereby adjust the wavefront of the main pulse laser beam L2.

Meanwhile, the reflected beam L3rm of the pre-pulse laser beam L3 transmitted through the beam splitter 611 may be incident on the wavefront sensor 613. The wavefront sensor 613 may measure the wavefront of the reflected beam L3rm as the wavefront of the pre-pulse laser beam L3. Data on the measured wavefront of the pre-pulse laser beam L3 may be inputted to the laser controller 105 via the beam controller 310, for example. The laser controller 105 may be configured to actuate the beam controller 310 based on the inputted wavefront of the pre-pulse laser beam L3, to thereby adjust the wavefront of the pre-pulse laser beam L3.

Of the multi-reflected beams reflected multiple times in the beam path adjusting part 130, the multi-reflected beam L2*trru* of the main pulse laser beam L2 and the multi-reflected beam L3*tru* of the pre-pulse laser beam L3 may be incident on a first surface of the wedge substrate 621. The wedge substrate 621 may transmit the multi-reflected beam L2*trru* with high transmissivity and reflect the multi-reflected beam L3*tru* with high reflectivity. The wedge substrate 621 may have, on the first surface thereof, a thin film coating having formed thereon, the thin film coating having high reflectivity for the multi-reflected beam L3*tru* and high transmissivity for the multi-reflected beam L2*trru*. Further, the wedge substrate 621 may have, on a second surface thereof, a thin film coating formed thereon, the thin film coating having high transmissivity for at least the multi-reflected beam L2*trru*. Furthermore, the wedge substrate 621 may have, on the second surface thereof, a thin film coating formed thereon, the thin film coating having high reflectivity for the multi-reflected beam L3*tru*.

The multi-reflected beam L2*trru* transmitted through the wedge substrate 621 may be incident on the beam profiler 622. The beam profiler 622 may measure the beam profile of the multi-reflected beam L2*trru* as the beam profile of the main pulse laser beam L2. Data on the measured beam profile may be inputted to the laser controller 105 via the beam controller 310, for example. The laser controller 105 may be configured to adjust the beam profile of the main pulse laser beam L2 based on the inputted data on the beam profile of the main pulse laser beam L2.

Meanwhile, the multi-reflected beam L3*tru* reflected by the wedge substrate 621 may be incident on the beam profiler 623. The beam profiler 623 may measure the beam profile of the multi-reflected beam L3*tru* as the beam profile of the pre-pulse laser beam L3. Data on the measured beam profile may be inputted to the laser controller 105 via the beam controller 310, for example. The laser controller 105 may be configured to adjust the beam profile of the pre-pulse laser beam L3 based on the inputted data on the beam profile of the pre-pulse laser beam L3.

As has been described so far, the beam parameters of the main pulse laser beam L2 may be measured by the multiple sensors (612 and 622). This may make it possible to measure the beam parameters of the main pulse laser beam L2 more quickly, accurately, and precisely. This in turn may make it possible to reduce processing time required to adjust the beam parameters of the main pulse laser beam L2. Similarly, the beam parameters of the pre-pulse laser beam L3 may be measured by the multiple sensors (613 and 623). This may make it possible to measure the beam parameters of the pre-pulse laser beam L3 more quickly, accurately, and precisely. This in turn may make it possible to reduce processing time required to adjust the beam parameters of the pre-pulse laser beam L3.

6.1 Modification of Sixth Embodiment

Figure 38:
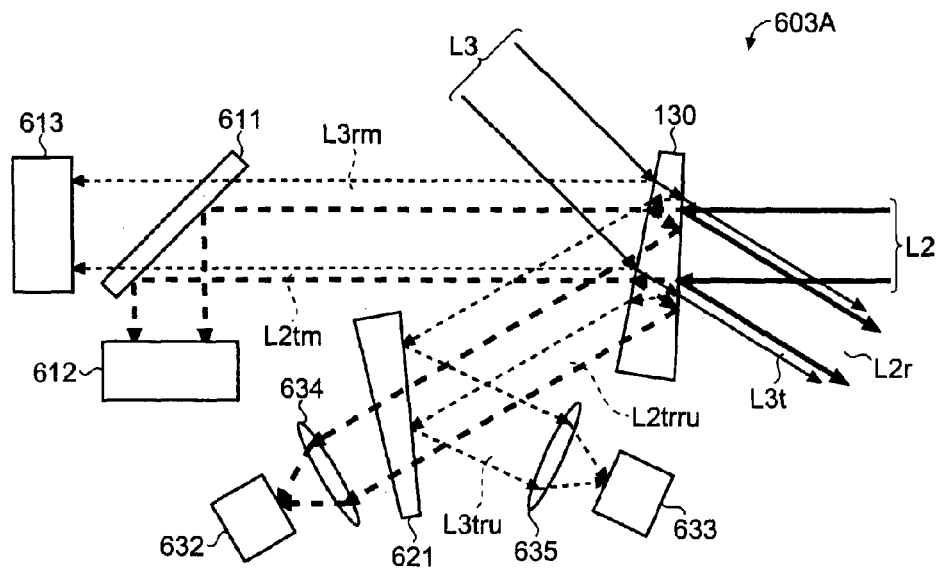
FIG. 38 illustrates a modification of the beam parameter measuring unit according to the sixth embodiment.

The beam parameter measuring unit according to the sixth embodiment may be modified as shown in FIG. 38. FIG. 38 illustrates a modification of the beam parameter measuring unit according to the sixth embodiment. As illustrated in FIG. 38, the beam profilers 622 and 623 shown in FIG. 37 may respectively be replaced by a focusing lens 634 and a beam profiler 632, and a focusing lens 635 and a beam profiler 633.

The focusing lens 634 may focus the multi-reflected beam L2*trru* of the main pulse laser beam L2 transmitted through the wedge substrate 621. The beam profiler 632 may be disposed at the focus of the focusing lens 634. With this, the beam profiler 632 may measure the beam profile of the multi-reflected beam L2*trru*, at the focus thereof, transmitted through the wedge substrate 621. Further, the beam profile of the transmitted beam L2*tm* may be measured by the beam profiler 612. As in the configuration shown in FIG. 5, the divergence, the traveling direction, the intensity profile, and so forth, of the main pulse laser beam L2 may be calculated from the measured data.

Similarly, the focusing lens 635 may focus the multi-reflected beam L3*tru* of the pre-pulse laser beam L3 reflected by the wedge substrate 621. The beam profiler 633 may be disposed at the focus of the focusing lens 635. With this, the beam profiler 633 may measure the beam profile of the multi-reflected beam L3*tru*, at the focus thereof, reflected by the wedge substrate 621. Further, the beam profile of the reflected beam L3*rm* may be measured by the beam profiler 613. As in the configuration shown in FIG. 5, the divergence, the traveling direction, the intensity profile, and so forth, of the pre-pulse laser beam L3 may be calculated from the measured data.

The above-described embodiments and the modifications thereof are merely examples for implementing this disclosure, and this disclosure is not limited thereto. Making various modifications according to the specifications or the like is within the scope of this disclosure, and it is apparent from the above description that other various embodiments are possible within the scope of this disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not being limited to the stated elements." The term "have" should be interpreted as "including the stated elements but not being limited to the stated elements." Further, the modifier "one (a/an)" should be interpreted as "at least one" or "one or more."

What is claimed is:

1. An optical device, comprising:
   a mirror configured:
      to reflect part of a first laser beam incident on one principal surface thereof as a first reflected beam and transmit the other part of the first laser beam through the mirror as a first transmitted beam, and
      to transmit part of a second laser beam incident on the other principal surface thereof through the mirror as a second transmitted beam and reflect the other part of the second laser beam as a second reflected beam;
   an optical system disposed so that the first and second laser beams are incident on the mirror such that a beam path of the first transmitted beam and a beam path of the second reflected beam are made to be parallel to each other or to substantially coincide with each other, or such that a beam path of the first reflected beam and a beam path of the second transmitted beam are made to be parallel to each other or to substantially coincide with each other;
   a first measuring unit configured to measure a beam parameter of at least one of the first transmitted beam and the first reflected beam; a second measuring unit configured to measure a beam parameter of at least one of the second reflected beam and the second transmitted beam;
   a first adjusting unit configured to adjust the first laser beam based on a measurement result by the first measuring unit; and
   a second adjusting unit configured to adjust the second laser beam based on a measurement result by the second measuring unit, wherein:

the first adjusting unit includes a first wavefront correction part for correcting a wavefront of the first laser beam, and a first beam direction correction part for correcting a direction in which the first laser beam travels, the second adjusting unit includes a second wavefront correction part for correcting a wavefront of the second laser beam, and a second beam direction correction part for correcting a direction in which the second laser beam travels, and the correction is performed so that a difference between a measured value and a target value falls within a predetermined acceptable range.

2. The optical device according to claim 1, wherein the mirror is a dichroic mirror provided with a coating for reflecting the second laser beam with high reflectivity and suppressing reflection of the first laser beam with high efficiency.

3. The optical device according to claim 1, wherein the mirror is a dichroic mirror provided with a coating for suppressing reflection of the second laser beam with high efficiency and for reflecting the first laser beam with high reflectivity.

4. The optical device according to claim 1, wherein the mirror includes a wedge substrate.

5. The optical device according to claim 1, wherein the mirror is configured to reflect part of the first laser beam incident on a first region thereof as the first reflected beam and transmit the other part as the first transmitted beam, and to transmit part of the second laser beam incident on a second region thereof as the second transmitted beam and reflect the other part as the second reflected beam.

6. The optical device according to claim 2, wherein the mirror includes a planar diamond substrate, and the coating is formed on at least one principal surface of the diamond substrate.

7. The optical device according to claim 3, wherein the mirror includes a planar diamond substrate, and the coating is formed on at least one principal surface of the diamond substrate.

8. A laser apparatus, comprising: the optical device according to claim 1.

9. An extreme ultraviolet light generation system, comprising:
the optical device according to claim 1;
a laser apparatus;
a chamber;
a droplet generator provided in the chamber, for supplying a target material into a predetermined region inside the chamber; and
a focusing optical system for focusing the first reflected beam and the second transmitted beam, respectively, in the predetermined region inside the chamber, or for focusing the first transmitted beam and the second reflected beam, respectively, in the predetermined region inside the chamber.

10. An optical device, comprising:
a mirror configured:
to reflect part of a first laser beam and part of a second laser beam incident on one principal surface thereof as a first reflected beam and a second reflected beam, respectively, and
to transmit the other parts of the respective laser beams through the mirror as a first transmitted beam and a second transmitted beam, respectively;
an optical system disposed so that the first and second laser beams are incident on the mirror such that a beam path of the first transmitted beam and a beam path of the second transmitted beam are made to substantially coincide with each other, or such that a beam path of the first reflected beam and a beam path of the second reflected beam are made to substantially coincide with each other;
a beam parameter measuring system including a first measuring unit for measuring a beam parameter of the first transmitted beam, and a second measuring unit for measuring a beam parameter of the second transmitted beam;
a first adjusting unit configured to adjust the first laser beam based on a measurement result by the first measuring unit; and
a second adjusting unit configured to adjust the second laser beam based on a measurement result by the second measuring unit, wherein:
the first adjusting unit includes a first wavefront correction part for correcting a wavefront of the first laser beam, and a first beam direction correction part for correcting a direction in which the first laser beam travels,
the second adjusting unit includes a second wavefront correction part for correcting a wavefront of the second laser beam, and a second beam direction correction part for correcting a direction in which the second laser beam travels, and
the correction is performed so that a difference between a measured value and a target value falls within a predetermined acceptable range.

11. The optical device according to claim 10, wherein the mirror is provided with a coating for reflecting the first and second laser beams with high reflectivity.

12. The optical device according to claim 10, wherein the mirror is provided with a coating for suppressing reflection of the first and second laser beams with high efficiency.

13. A laser apparatus, comprising: the optical device according to claim 10.

14. An extreme ultraviolet light generation system, comprising:
the optical device according to claim 10;
a laser apparatus;
a chamber;
a droplet generator provided in the chamber, for supplying a target material into a predetermined region inside the chamber; and
a focusing optical system for focusing the first reflected beam and the second reflected beam, respectively, in the predetermined region inside the chamber.

15. The optical device according to claim 11, wherein the mirror includes a planar diamond substrate, and the coating is formed on at least one principal surface of the diamond substrate.

16. The optical device according to claim 12, wherein the mirror includes a planar diamond substrate, and the coating is formed on at least one principal surface of the diamond substrate.

* * * * *